(12) United States Patent
Janssen et al.

(10) Patent No.: US 11,646,137 B2
(45) Date of Patent: May 9, 2023

(54) RESISTOR CIRCUIT

(71) Applicant: X-FAB Global Services GmbH, Erfurt (DE)

(72) Inventors: Guido Janssen, Erfurt (DE); Klaus Heinrich, Erfurt (DE); Tillmann Walther, Dresden (DE); Xuezhou Cao, Plymouth (GB); Jee Chang Lai, Kuching (MY)

(73) Assignee: X-FAB GLOBAL SERVICES GMBH, Erfurt (DE)

( * ) Notice: Subject to any disclaimer, the term of this patent is extended or adjusted under 35 U.S.C. 154(b) by 11 days.

(21) Appl. No.: 17/172,867

(22) Filed: Feb. 10, 2021

(65) Prior Publication Data
US 2021/0249163 A1 Aug. 12, 2021

(30) Foreign Application Priority Data
Feb. 11, 2020 (GB) ..................... 2001878

(51) Int. Cl.
*H01C 17/00* (2006.01)
*H01C 1/16* (2006.01)
*H01L 27/08* (2006.01)

(52) U.S. Cl.
CPC ............ *H01C 17/00* (2013.01); *H01C 1/16* (2013.01); *H01L 27/0802* (2013.01)

(58) Field of Classification Search
CPC ........ H01C 17/00; H01C 1/16; H01L 27/0802
See application file for complete search history.

(56) References Cited

U.S. PATENT DOCUMENTS

| 5,448,103 A | 9/1995 | De Wit | |
|---|---|---|---|
| 6,351,111 B1 | 2/2002 | Laraia | |
| 6,960,979 B2 | 11/2005 | Banerjee | |
| 2004/0196073 A1* | 10/2004 | Hiramatsu | G01R 19/16538 327/89 |
| 2010/0007322 A1* | 1/2010 | Huang | G05F 3/242 323/312 |

(Continued)

FOREIGN PATENT DOCUMENTS

JP S6428857 A 1/1989

OTHER PUBLICATIONS

JP01-028857 (same as JPS6428857), Watanabe et al., machine translation. (Year: 1989).*

(Continued)

*Primary Examiner* — Kyung S Lee
(74) *Attorney, Agent, or Firm* — Dority & Manning, P.A.

(57) ABSTRACT

A method of forming a resistor circuit, the method comprising forming a first resistor comprising a first type of resistor, forming a second resistor comprising a second type of resistor, the first type of resistor being different from the second type of resistor and simultaneously doping a first part of the first resistor and a second part of the second resistor, the first resistor and the second resistor being configured such that doping of the first part of the first resistor and the second part of the second resistor defines a temperature coefficient of the first resistor and a temperature coefficient of the second resistor, wherein the temperature coefficient of the first resistor and the temperature coefficient of the second resistor have opposite signs.

20 Claims, 11 Drawing Sheets

(56) References Cited

U.S. PATENT DOCUMENTS

2012/0181612 A1* 7/2012 Yang ................ H01L 27/0629
                                                  257/E21.294
2016/0155547 A1* 6/2016 Yuan ..................... H01C 7/06
                                                       338/9
2021/0408221 A1* 12/2021 Nandakumar .......... H01L 28/20

OTHER PUBLICATIONS

Gregoire et al. "Process-Independent Resistor Temperature-Coefficients using Series/Parallel and Parallel/Series Composite Resistors," 2007, IEEE International Symposium on Circuits and Systems—4 pages.
Sadeghi et al. "Analysis and design of monolithic resistors with a desired temperature coefficient using contacts," *IET Circuits, Devices & Systems*, Feb. 2013, vol. 7, Iss. 4, pp. 185-192.
Combined Search & Examination Report for corresponding GB Application No. GB2001878.4, dated Jul. 13, 2020—2 pages.
Search Report for corresponding GB Application No. GB2001878.4, dated Jul. 10, 2020—1 page.

* cited by examiner

Forming a first resistor comprising a first type of resistor
(1005)

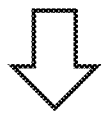

Forming a second resistor comprising a second type of resistor, the first type of resistor being different from the second type of resistor
(1010)

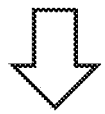

Simultaneously doping a first part of the first resistor and a second part of the second resistor, the first resistor and the second resistor being configured such that doping of the first part of the first resistor and the second part of the second resistor defines a temperature coefficient of the first resistor and a temperature coefficient of the second resistor, the temperature coefficient of the first resistor and the temperature coefficient of the second resistor having opposite signs
(1015)

Fig. 1

RESISTOR CIRCUIT

FIELD

The present disclosure relates to a method of forming a resistor circuit and associated apparatuses and methods.

BACKGROUND

Many semiconductor devices and integrated circuits are designed to operate over a wide range of temperatures. For example, a circuit may be specified to perform consistently over a certain temperature range. However, in semiconductor physics, the mobility of the charge carriers within the semiconductor device or one or more parts thereof depends on temperature. The mobility of the charge carriers is inversely proportional to the resistivity. In other words, when the mobility of the charge carriers increases, the resistivity decreases and when the mobility of the charge carriers decreases, the resistivity increases. The temperature dependence of the mobility or the resistivity may lead to a temperature dependent performance of the semiconductor devices and the integrated circuits, which may not be desirable.

SUMMARY

In described examples, there is provided a method of forming a resistor circuit and associated apparatus. The method of forming a resistor circuit and associated apparatuses and methods may address one or more problems identified in the background section.

According to a first aspect of the present disclosure there is provided a method of forming a resistor circuit, the method comprising forming a first resistor comprising a first type of resistor, forming a second resistor comprising a second type of resistor, the first type of resistor being different from the second type of resistor, and simultaneously doping a first part of the first resistor and a second part of the second resistor, the first resistor and the second resistor being configured such that doping of the first part of the first resistor and the second part of the second resistor defines a temperature coefficient of the first resistor and a temperature coefficient of the second resistor, wherein the temperature coefficient of the first resistor and the temperature coefficient of the second resistor have opposite signs.

It will be appreciated that the term "temperature coefficient of the first resistor" may be interchangeably used with the term "first temperature coefficient." In the present disclosure the term "first temperature coefficient" should be understood as a temperature coefficient associated with the first resistor.

The term "temperature coefficient of the second resistor" may be interchangeably used with the term "second temperature coefficient." In the present disclosure the term "second temperature coefficient" should be understood as a temperature coefficient associated with the second resistor.

The temperature coefficient of the first resistor may comprise a linear or first-order temperature coefficient. The terms "linear temperature coefficient of the first resistor" or "first-order temperature coefficient of the first resistor" may be interchangeably used with the terms "a first linear temperature coefficient" or "a first first-order temperature coefficient," respectively.

The temperature coefficient of the first resistor may comprise a quadratic or second-order temperature coefficient. The terms "quadratic temperature coefficient of the first resistor" or "second-order temperature coefficient of the first resistor" may be interchangeably used with the terms "a first quadratic temperature coefficient" or "a first second-order temperature coefficient," respectively.

The temperature coefficient of the second resistor may comprise a linear or first-order temperature coefficient. The terms "linear temperature coefficient of the second resistor" or "first-order temperature coefficient of the second resistor" may be interchangeably used with the terms "a second linear temperature coefficient" or "a second first-order temperature coefficient," respectively.

The temperature coefficient of the second resistor may comprise a quadratic or second-order temperature coefficient. The terms "quadratic temperature coefficient of the second resistor" or "second-order temperature coefficient of the second resistor" may be interchangeably used with the terms "a second quadratic temperature coefficient" or "a second second-order temperature coefficient," respectively.

The doping of the first part may define or determine a resistivity or sheet resistance of the first resistor. The doping of the second part may define or determine a resistivity or sheet resistance of the second resistor.

By simultaneously doping the first part of the first resistor and the second part of the second resistor, the influence of one or more process variations on the resistor circuit. e.g. a temperature dependence of the resistor circuit, may be reduced. The terms "process variations" may be considered as encompassing one or more variations in a dopant dose, e.g. a dopant concentration in the first part of the first resistor and/or the second part of the second resistor, a dopant energy, e.g. a depth of the dopants in the first part of the first resistor and/or the second part of the second resistor.

The one or more process variations may lead to a variation, e.g. a statistical variation, in the resistivity or sheet resistance of the first resistor and/or the resistivity or sheet resistance of the second resistor. Additionally or alternatively, the one or more process variations may lead to a variation, e.g. a statistical variation, in the temperature coefficient of the first resistor and/or the temperature coefficient of the second resistor. For example, when a first resistor (or a part thereof) and a second resistor (or a part thereof) are doped separately, e.g. in separate method or process steps, the variation in the temperature coefficient of the first resistor, the temperature coefficient of the second resistor, the resistivity or sheet resistance of the first resistor and/or the resistivity or sheet resistance of the second resistor may be unequal. This may make compensation of the temperature coefficients of the first and second resistors difficult or even impossible. Therefore, a resistor circuit comprising separately doped first and second resistors may have a temperature dependence, which may be sensitive to or depend on the one or more process variations.

A reduction of the influence of process variations may allow for an improved compensation of the temperature coefficients of the first and second resistors, for example when the first and second resistors are coupled or connected to one another. Expressed differently, a temperature dependence of the resistivity or sheet resistance of the first resistor and a temperature dependence of the resistivity or sheet resistance of the second resistor may be compensated or compensable, e.g. when the first and second resistors are connected or coupled together. This is turn may allow for the formation of an improved temperature independent resistor circuit. By simultaneously doping the first part of the first resistor and the second part of the second resistor, the one or more process variations that may occur during the doping step may have substantially the same or a similar influence on the resistivity or sheet resistance of the first resistor and the resistivity or sheet resistance of the second resistor. The one or more process variations may, therefore, have no or a reduced influence on the compensation of the temperature coefficient of the first resistor and the temperature coefficient of the second resistor. Expressed differently, a temperature dependency of the resistor circuit may be less sensitive to or less dependent on the one or more process variations. The resistor circuit may be temperature independent (e.g. substantially temperature independent) and/or insensitive (e.g. substantially insensitive) to the one or more process variations.

By simultaneously doping the first part of the first resistor and the second part of the second resistor, the resistivity or sheet resistances of the first resistor and the resistivity or sheet resistance of the second resistor may be correlated. Additionally or alternatively, the temperature coefficient of the first resistor and the temperature coefficient of the second resistor may be correlated. Expressed differently, in examples where the one or more process variations cause a lower or decreased dopant concentration in the first and second parts of the first and second resistors, respectively, the resistivity or sheet resistance of the first resistor and the resistivity or sheet resistance of the second resistor may increase, e.g. increase linearly to each other. Additionally, the temperature coefficient of the first resistor and the temperature coefficient of the second resistor, e.g. a value or absolute value thereof, may increase, e.g. increase linearly to each other. Alternatively in examples where the one or more process variations cause a higher or increased dopant concentration in the first and second parts of the first and second resistors, respectively, the resistivity or sheet resistance of the first resistor and the resistivity or sheet resistance of the second resistor may decrease, e.g. decrease linearly to each other. Additionally, the temperature coefficient of the first resistor, e.g. a value or absolute value thereof, and the temperature coefficient, e.g. a value or absolute value thereof, may decrease, e.g. decrease linearly to each other. The sign of the temperature coefficient of the first resistor and the sign of the temperature coefficient of the second resistor may remain unchanged or unaffected by the decrease or increase of the doping concentration in the first and second parts, which may be due to the one or more process variations. As a result, variations in the temperature coefficient of the first resistor, the temperature coefficient of the second resistor, the resistivity or sheet resistance of the first resistor and/or the resistivity or sheet resistance of the second resistor may be equal (e.g. substantially equal) and/or may be compensable.

The first resistor or first type of resistor may comprise a first configuration or arrangement. The second resistor or second type of resistor may comprise a second configuration or arrangement. The first configuration or arrangement may be different from the second configuration or arrangement.

The first and second types of resistors (or the first and second resistors) may be or comprise resistors for which a change in a doping dose or doping concentration may cause a change in the temperature coefficients (e.g. the temperature coefficients of the first and second resistors), e.g. a value or absolute value of the temperature coefficients, of the resistors, e.g. of each of the resistors. The sign of the temperature coefficients may remain unchanged or unaffected by the change in the doping dose or doping concentration. In other words, the first and second types of resistors may be or comprise resistors for which an increase in a doping dose or doping concentration may cause an decrease in the temperature coefficients, e.g. a value or absolute value of the temperature coefficients, of the resistors, e.g. of each of the resistors. Alternatively, the first and second types of resistors may be or comprise resistors for which a decrease in a doping dose or doping concentration may cause an increase in the temperature coefficients, e.g. a value or absolute value of the temperature coefficients, of the resistors, e.g. of each of the resistors. The signs of the temperature coefficients may remain unchanged or unaffected by the increase or decrease in the doping dose or doping concentration.

The first resistor may comprise a plurality of first parts. The second resistor may comprise a plurality of second parts. The method may comprise simultaneously doping the plurality of first parts and the plurality of second parts. The first resistor and the second resistor may be configured such that doping of the plurality of first parts and the plurality of second parts defines the temperature coefficient of the first resistor and the temperature coefficient of the second resistor.

At least one or each first part of the plurality of first parts may comprise an elongated shape. In other words, a length of at least one or each first part of the plurality of first parts may be larger than a width of the at least one or each first part of the plurality of first parts. The plurality of first parts may be arranged so that at least one or each first part of the plurality of first parts is adjacent and/or parallel (e.g. substantially parallel) to at least one other first part of the plurality of first parts. Alternatively, the plurality of first parts may be arranged so that at least one or each first part of the plurality of first part is perpendicular (e.g. substantially perpendicular) to at least one other first part of the plurality of first parts.

At least one or each first part of the plurality of first parts may be connected or coupled, such as for example electrically connected or coupled, to at least one other first part of the plurality of first parts. The at least one or each first part of the plurality of first parts may be connected or coupled in series or parallel to the at least one other first part of the plurality of first parts.

At least one or each second part of the plurality of second parts may comprise an elongated shape. In other words, a length of at least one or each second part of the plurality of second parts may be larger than a width of the at least one or each second part of the plurality of second parts. The plurality of second parts may be arranged so that at least one or each second part of the plurality of second parts is adjacent and/or parallel (e.g. substantially parallel) to at least one other second part of the plurality of second parts. Alternatively, the plurality of second parts may be arranged so that at least one or each second part of the plurality of second part is perpendicular (e.g. substantially perpendicular) to at least one other second part of the plurality of second parts.

At least one or each second part of the plurality of second parts may be connected or coupled, such as for example electrically connected or coupled, to at least one other second part of the plurality of second parts. At least one or each second part of the plurality of second parts may be connected or coupled in series or parallel to at least one other second part of the plurality of second parts.

The plurality of first parts and the plurality of second parts may be alternately arranged. In other words, at least one or each first part of the plurality of first parts may be arranged side by side, adjacent and/or parallel (e.g. substantially parallel) to at least one or each second part of the plurality of second parts, or vice versa. By alternately arranging the plurality of first parts and the plurality of second parts, the resistor circuit may be more compact and/or space efficient.

Alternatively, at least one or each first part of the plurality of first parts may be arranged perpendicularly (e.g. substantially perpendicularly) relative to at least one or each second part of the plurality of second parts, or vice versa.

The first part or at least one first part of the plurality of first parts and the second part or at least one second part of the plurality of second parts may form, define or be comprised in a resistor cell or segment. The first part or the at least one first part of the plurality of first parts and the second part or the at least one second part of the plurality of second parts may be coupled or connected, e.g. electrically coupled or connected, to one another, such as for example in parallel or series. The resistor circuit may comprise a plurality of resistor cells or segments. At least one or each resistor cell or segment of the plurality of resistor cells or segments may be connected or coupled, e.g. electrically connected or coupled, to at least one other resistor cell or segment of the plurality of resistor cells or segments, e.g. in series or parallel. Additionally or alternatively, the resistor cell or segment or at least one resistor cell or segment of the plurality of resistor cells or segments may be connected to another resistor or part thereof.

The step of forming the first resistor and/or the second resistor may comprise selecting one or more parameters of the first resistor and/or the second resistor, e.g. so that the temperature coefficient of the first resistor and the temperature coefficient of the second resistor may be compensable or compensate each other, for example when the first resistor and the second resistor are connected or coupled together. The one or more parameters may comprise one or more of: a number of first parts, a first length of the first part, at least one or each first part of the plurality of first parts, a first width of the first part, at least one or each first part of the plurality of first parts, a first thickness of the first part, at least one or each first part of the plurality of first parts, a number of second parts, a second length of the second part, at least one or each second part of the plurality of second parts, a second width of the second part, at least one or each second part of the plurality of second parts and a second thickness of the second part, at least one or each second part of the plurality of second parts. The first length may be or comprise a first effective length. The first effective length may be or comprise a space or a distance between at least two contacts of the first resistor. For example, a contact may be arranged on at least one or each end or end portion of the first part, at least one or each part of the plurality of first parts. The second length may be or comprise a second effective length. The second effective length may be or comprise a space or distance between at least two contacts of the second resistor. For example, a contact may be arranged on at least one or each end or end portion of the second part, at least one or each part of the plurality of second parts.

The one or more parameters may be selected based on one or more of: a material of the first part, at least one or each first part of the plurality of first parts, a material of the second part, at least one or each second part of the plurality of second parts, another material of another part of the first and/or the second resistor, one or more dopants used to dope the first part or the plurality of first parts and the second part or the plurality of second parts, a grain size of the material of the first part, at least one or each first part of the plurality of first parts, a grain size of the material of the second part, at least one or each second part of the plurality of second parts and/or a grain size of the other material of the other part of the first and/or second resistor. The material of the first part, at least one or each first part of the plurality of first parts and/or the material of the second part, at least one or each second part of the plurality of second parts may comprise a semiconductor material, such as a polycrystalline material or a single crystalline material. The material of the other part of the first and/or second resistor may comprise another semiconductor material, such as another polycrystalline material or another single crystalline material. The material and the other material may be the same or different.

By selecting the one or more parameters of the first resistor and/or second resistor, the resistivity or sheet resistance of the first resistor and/or the resistivity or sheet resistance of the second resistor may be changed, varied or adjusted. This may additionally result in a change, variation or adjustment of the temperature coefficient of the first resistor and/or the temperature coefficient of the second resistor. A change, variation or adjustment in the resistivity or sheet resistance of the first resistor, the temperature coefficient of the first resistor, the resistivity or sheet resistance of the second resistor and/or the temperature coefficient of the second resistor may allow for the compensation of the variations, which may be equal (or substantially equal), in the resistivity or sheet resistance of the first resistor, the resistivity or sheet resistance of the second resistor, the temperature coefficient of the first resistor and/or the temperature coefficient of the second resistor, e.g. due to the one or more process variations. Additionally or alternatively, the change, variation or adjustment in the resistivity or sheet resistance of the first resistor, the temperature coefficient of the first resistor, the resistivity or sheet resistance of the second resistor and/or the temperature coefficient of the second resistor may allow for the compensation of the temperature coefficient of the first resistor and the temperature coefficient of the second resistor, thereby making the resistor circuit temperature independent. e.g. substantially temperature independent.

The step of selecting the one or more parameters may comprise selecting the one or more parameters of the first resistor such that a length to width ratio of the first part, at least one or each first part of the plurality of first parts is about 1. The step of selecting the one or more parameters may comprise selecting the one or more parameters of the second resistor such that a length to width ratio of the second part, at least one or each second part of the plurality of second parts is about 0.2.

Additionally or alternatively, the method may comprise selecting a number of resistor cells or segments to change, vary or adjust a resistivity of the resistor circuit.

The step of simultaneously doping the first part or the plurality of first parts and the second part or the plurality of second parts may comprise doping the first part or the plurality of first parts and the second part or the plurality of second parts with at least one of: the same dopant or dopants, the same dopant dose and/or dopant concentration (e.g. substantially the same dopant dose and/or dopant concentration), and the same dopant energy (e.g. substantially the same dopant energy). The step of simultaneously doping the first part or the plurality of first parts and the second part or the plurality of second parts may comprise doping the first part or the plurality of first parts and the second part or the plurality of second parts so that the first resistor comprises a sheet resistance (e.g. at room temperature, e.g. about 27° C.) of about 20 to 200 $\Omega$/sq, 40 to 150 $\Omega$/sq, 50 to 100 $\Omega$/sq, 10 to 300 $\Omega$/sq, or 50 to 250 $\Omega$/sq, such as for example about 50 to 80 $\Omega$/sq or 90 to 170 $\Omega$/sq. The step of simultaneously doping the first part or the plurality of first parts and the second part or the plurality of second parts may comprise doping the first part or the plurality of first parts and the second part or the plurality of second parts so that the second resistor comprises a sheet resistance (e.g. at room temperature, e.g. about 27° C.) of about 50 to 500 Ω/sq, 100 to 400 Ω/sq, 150 to 450 Ω/sq, such as for example about 220 to 340 Ω/sq or 200 to 400 Ω/sq.

The step of forming the first resistor and/or the second resistor may comprise providing a substrate. The step of forming the first resistor and/or the second resistor may comprise forming at least one insulating portion or a plurality of insulating portions on or in the substrate.

The step of forming the first resistor may comprise forming a well region in the substrate. The first part or the plurality of first parts may be comprised in or defined by at least a part or a plurality of parts of the well region. The step of forming the first resistor may comprise forming a plurality of well regions in the substrate. At least one or each first part of the plurality of first parts may be associated with, comprised in and/or defined by at least part of a respective well region of the plurality of well regions.

The step of forming the second resistor may comprise depositing a material, e.g. a semiconductor material, on the at least one insulating portion, e.g. to form the second part or the plurality of second parts. The step of forming the second resistor may comprise depositing the material, e.g. the semiconductor material, on at least one or each insulating portion of the plurality of insulating portions, e.g. to form at least one second part on the at least one or each insulating portion of the plurality of insulating portion.

The method may comprise forming one or more contacts on the first part, at least one or each first part of the plurality of first parts and/or the second part, at least one or each second part of the plurality of second parts (e.g. at least one or each end or end portion thereof), e.g. for connecting or coupling, e.g. electrically connecting or coupling, the first resistor and the second resistor to one another. The method may comprise forming one or more contacts on at least one or each first part of the plurality of first parts, e.g. for connecting or coupling, e.g. electrically connecting or coupling, the at least one or each first part of the plurality of first parts to at least one other first part of the plurality of first parts or at least one second part of the plurality of second parts. The method may comprise forming one or more contacts on at least one or each second part of the plurality of second parts, e.g. for connecting or coupling, e.g. electrically connecting or coupling, the at least one or each second part of the plurality of second parts to at least one first part of the plurality of first parts or at least one other second part of the plurality of second parts.

The method may comprise connecting or coupling the first resistor and the second resistor to one another, for example such that the temperature coefficient of the first resistor and the temperature coefficient of the second resistor compensate, e.g. substantially compensate, each other. This may allow the resistor circuit to be temperature independent, e.g. substantially temperature independent. For example, the method may comprise connecting the first resistor and the second resistor in parallel or series.

The method may comprise connecting or coupling, e.g. electrically connecting or coupling, at least one or each first part of the plurality of first parts to at least one other first part of the plurality of first parts or at least one second part of the plurality of second parts. The at least one or each first part of the plurality of first parts may be connected or coupled to the at least one other first part of the plurality of first parts or the at least one second part of the plurality of second parts in series or in parallel. The method may comprise connecting or coupling, e.g. electrically connecting or coupling, at least one or each second part of the plurality of second parts to at least one other second part of the plurality of second parts or at least one first part of the plurality of first parts. The at least one or each second part of the plurality of second parts may be connected or coupled to the at least one other second part of the plurality of second parts or the at least one first part of the plurality of first parts in series or in parallel.

The method may comprise forming a third resistor.

The method may comprise doping a third part of the third resistor at the same time as the first part of the first resistor and the second part of the second resistor. Expressed differently, the method may comprise simultaneously doping the third part of the third resistor, the first part of the first resistor and the second part of the second resistor. The third resistor may be configured such that doping of the third part of the third resistor defines a temperature coefficient of the third resistor.

It will be appreciated that the term "temperature coefficient of the third resistor" may be interchangeably used with the term "third temperature coefficient." In the present disclosure the term "third temperature coefficient" should be understood as a temperature coefficient associated with the third resistor.

The temperature coefficient of the third resistor may comprise a linear temperature coefficient or first-order temperature coefficient. The terms "linear temperature coefficient of the third resistor" or "first-order temperature coefficient of the third resistor" may be interchangeably used with the terms "a third linear temperature coefficient" or "a third first-order temperature coefficient," respectively.

The temperature coefficient of the third resistor may comprise a quadratic temperature coefficient or second-order temperature coefficient. The terms "quadratic temperature coefficient of the third resistor" or "second-order temperature coefficient of the third resistor" may be interchangeably used with the terms "a third quadratic temperature coefficient" or "a third second-order temperature coefficient," respectively.

The temperature coefficient of the third resistor may be different from at least one of the temperature coefficient of the first resistor and the temperature coefficient of the second resistor. The temperature coefficient of the third resistor may have a sign opposite to at least one of the temperature coefficient of the first resistor and the temperature coefficient of the second resistor.

The third resistor may comprise a plurality of third parts. The method may comprise simultaneously doping the plurality of first parts, the plurality of second parts and the plurality of third parts. The third resistor may be configured such that doping of the plurality of third parts defines the temperature coefficient of the third resistor.

The method may comprise forming one or more contacts on the third part, at least one or each third part of the plurality of third parts (e.g. at least one or each end or end portion thereof), e.g. for connecting or coupling, such as, electrically connecting or coupling, the third resistor to the first and/or second resistor.

The method may comprise forming one or more contacts on the third part, at least one or each third part of the plurality of third parts, e.g. for connecting or coupling, such as electrically connecting or coupling, the at least one or each third part of the plurality of third parts to at least one other third part of the plurality of third parts, the first part, at least one or each first part of the plurality of first parts and/or the second part, at least one or each second part of the plurality of second parts.

The method may comprise connecting or coupling, e.g. electrically connecting or coupling, at least one or each third part of the plurality of third parts to at least one other third part of the plurality of third parts, the first part, at least one or each first part of the plurality of first parts and/or the second part, at least one or each second part of the plurality of second parts. The at least one or each third part of the plurality of third parts may be connected or coupled to the at least one other third part of the plurality of third parts, the first part, at least one or each first part of the plurality of first parts and/or the second part, at least one or each second part of the plurality of second parts in series or in parallel.

The method may comprise connecting or coupling, e.g. electrically connecting or coupling, the third resistor to the first resistor, the second resistor and/or the resistor cell or segment or at least one or each resistor cell or segment of the plurality of resistor cells or segments, for example such that the temperature coefficient of the first resistor, the temperature coefficient of the second resistor and the temperature coefficient of the third resistor compensate, e.g. substantially compensate, each other. This may allow for the resistor circuit to be temperature independent, e.g. substantially temperature independent. For example, the method may comprise connecting or coupling the third resistor in series or parallel with the first resistor, the second resistor and/or the resistor cell or segment or at least one or each resistor cell or segment of the plurality of resistor cells or segments. The first resistor and the second resistor may be connected or coupled in parallel or in series.

According to a second aspect of the present disclosure there is provided a resistor circuit formed or formable using the method of the first aspect.

The temperature coefficient of the first resistor may be positive. The temperature coefficient of the second resistor may be negative. The temperature coefficient of the third resistor may be positive or negative. The resistor circuit may define or comprise a temperature independent resistor circuit. The resistor circuit may be, form or comprise a complementary metal-oxide semiconductor (CMOS) resistor or resistor circuit.

The third resistor may be or comprise the first type of resistor or the second type of resistor. The first resistor may be or comprise a diffusion resistor. Alternatively, the first resistor may be or comprise a well resistor. The second resistor may be or comprise a polycrystalline resistor. The third resistor may be or comprise a diffusion resistor, well resistor or a polycrystalline resistor.

Any features disclosed in relation to the method of the first aspect may apply or be comprised in the resistor circuit of the second aspect, or vice versa.

According to a third aspect of the present disclosure there is provided a method of forming a first resistor and a second resistor for use in a resistor circuit, the first resistor comprising a first type of resistor and the second resistor comprising a second type of resistor, the first type of resistor being different from the second type of resistor, the method comprising simultaneously doping a first part of the first resistor and a second part of the second resistor, the first resistor and the second resistor being configured such that doping of the first part of the first resistor and the second part of the second resistor defines a temperature coefficient of the first resistor and a temperature coefficient of the second resistor, wherein the temperature coefficient of the first resistor and the temperature coefficient of the second resistor have opposite signs.

The method of the third aspect may comprise any features of the method of the first aspect and/or the resistor circuit of the second aspect.

According to a fourth aspect of the present disclosure there is provided a first resistor and a second resistor for use in a resistor circuit, the first resistor and the second resistor being formed or formable using the method of the third aspect.

The first resistor and the second resistor of the fourth aspect may comprise any features of the first resistor and the second resistor disclosed in second aspect.

It should be understood that the features defined above in accordance with any aspect, example or embodiment or below in relation to any specific embodiment described herein may be utilised, either alone or in combination with any other defined feature, in any other aspect, example or embodiment described herein. Furthermore, the present invention is intended to cover apparatus comprising or configured to perform any feature described herein in relation to a method and/or a method of using or producing or manufacturing any apparatus feature described herein.

BRIEF DESCRIPTION OF THE DRAWINGS

Various embodiments will now be described by way of example only and with reference to the following drawings, in which:

FIG. 1 depicts a flow chart of an exemplary method of forming at least a part of a resistor circuit;

DETAILED DESCRIPTION

Figure 2:
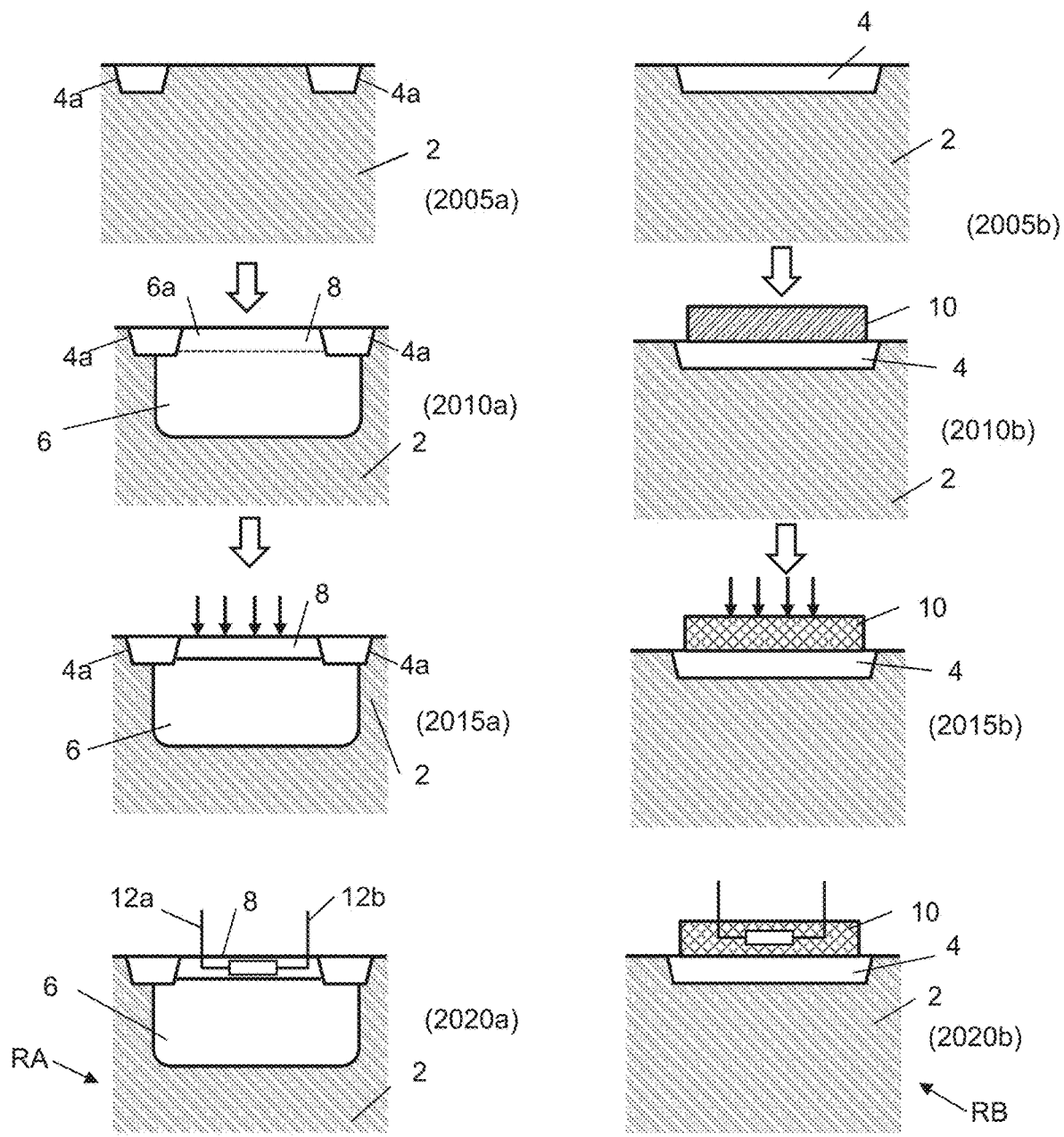
FIG. 2 schematically depicts an exemplary process flow of the method of forming the resistor circuit of FIG. 1.

FIG. 1 shows a flow chart of a method of forming a resistor circuit (or a part thereof). The method comprises forming a first resistor RA (step 1005). The method comprises forming a second resistor RB (step 1010).

The first resistor RA is or comprises a first type of resistor. The second resistor RB is or comprises a second type of resistor. The first type of resistor is different from the second type of resistor. In other words, the first resistor RA or first type of resistor may comprise a first configuration or arrangement and the second resistor RB or second type of resistor comprises a second configuration or arrangement. As will be described below, the first configuration or arrangement is different from the second configuration or arrangement.

The temperature behaviour of a resistor R(T) can be expressed in terms of temperature coefficients, which are derived from a Taylor series expansion around a nominal temperature T0:

$$R(T)=R(T0)*(1+TC1*(T-T0)+TC2*(T-T0)^2)$$

where TC1 is the first-order or linear temperature coefficient and TC2 is the second-order or quadratic temperature coefficient. The linear and quadratic temperature coefficients TC1, TC2 may be considered as describing a change of the resistivity or sheet resistance of a resistor in dependence on a change in temperature.

In this example, a temperature coefficient of the first resistor RA may be considered as describing a change of the resistivity or sheet resistance of the first resistor RA in dependence on a change in temperature. A temperature coefficient of the second resistor RB may be considered as describing a change of the resistivity or sheet resistance of the second resistor RB in dependence on a change in temperature.

The temperature coefficient of the first resistor RA may comprise a linear or first-order temperature coefficient TC1A. The temperature coefficient of the first resistor RA may comprise a quadratic or second-order temperature coefficient TC2A. The temperature coefficient of the second resistor RB may comprise a linear or first-order temperature coefficient TC1B. The temperature coefficient of the second resistor RB may comprise a quadratic or second-order temperature coefficient TC2B. It will be appreciated that the terms "linear temperature coefficient" and "first-order temperature coefficient" may be interchangeably used. Additionally or alternatively, the terms "quadratic temperature coefficient" and "second-order temperature coefficient" may be interchangeably used.

The linear and/or quadratic temperature coefficients TC1A, TC2A of the first resistor RA may be different from the linear and/or quadratic temperature coefficients TC1B, TC2B of the second resistor RB. For example, the linear temperature coefficient TC1A of the first resistor RA and the linear temperature coefficient TC1B of the second resistor may have opposite signs. Expressed differently, the linear temperature coefficient TC1A of the first resistor RA may be positive and the linear temperature coefficient TC1B of the second resistor RB may be negative, or vice versa. This may allow for compensation of the linear temperature coefficient TC1A of the first resistor RA and the linear temperature coefficient TC1B of the second resistor RB, as will be described below. It will be appreciated that the quadratic temperature coefficients TC2A, TC2B of the first and second resistors RA, RB may also be compensated, as will be described below. Expressed differently, a temperature dependence of the resistivity or sheet resistance of the first resistor RA and a temperature dependence of the resistivity or sheet resistance of the second resistor RB may be compensated. This in turn may allow for a temperature independent behaviour of the resistor circuit. As such, the resistor circuit may comprise or define a temperature independent resistor (e.g. a substantially temperature independent resistor). The terms "temperature independent resistor" may be considered as encompassing a low temperature or substantially zero-temperature coefficient resistor. The resistor circuit may be temperature independent for a temperature range of about −50 to 200° C. For temperatures higher than 200° C., intrinsic charge carrier generation in a material of the first and/or second resistors (e.g. the first and/or second parts thereof) may increase, which may affect the performance of the resistor circuit.

The method comprises simultaneously doping a first part of the first resistor and a second part of the second resistor. The first resistor RA and the second resistor RB may be configured such that doping of the first part of the first resistor RA and the second part of the second resistor RB defines the linear and/or quadratic temperature coefficients TC1A, TC2A of the first resistor RA and the linear and/or quadratic temperature coefficients TC1B, TC2B of the second resistor RB (step 1015). The terms "simultaneously doping" may be considered as encompassing doping the first part of the first resistor RA and the second part of the second resistor RB at the same time. The terms "simultaneously" and "at the same time" may be interchangeably used.

By simultaneously doping a first part of the first resistor and a second part of the second resistor, the influence of one or more process variations on the resistor circuit, e.g. a temperature dependence of the resistor circuit may be reduced. The terms "process variations" may be considered as encompassing one or more variations in the dopant dose, e.g. the dopant concentration in the first part of the first resistor RA and/or the second part of the second resistor RB, the dopant energy, e.g. a depth of the dopants in the first part of the first resistor RA and/or the second part of the second resistor RB. Process variations may lead to variations in the resistivity or sheet resistance of the first resistor RA and the resistivity or sheet resistance of the second resistor RB. As such, process variations may lead to variations or changes in the linear and/or quadratic temperature coefficients TC1A, TC2A of the first resistor RA and the linear and/or quadratic temperature coefficients TC1B, TC2B of the second resistor RB. For example, when the first part of the first resistor and the second part of the second resistor are doped separately or in separate process/method steps, the variations or changes in the temperature coefficients of the first and/or second resistors, the resistivity or sheet resistance of the first resistor and/or the resistivity or sheet resistance of the second resistor may be unequal. This may make compensation of the temperature coefficients of the first and second resistors difficult or even impossible. Therefore, a resistor circuit comprising separately doped first and second resistors may have a temperature dependence, which may be sensitive to the one or more process variations.

However, the reduced influence of process variations may result in an improved compensation of the linear and/or quadratic temperature coefficients TC1A, TC2A, TC1B, TC2B of the first and second resistors RA, RB, for example when the first and second resistors RA, RB are coupled or connected to one another. This is turn may allow for the formation of an improved temperature independent resistor. By simultaneously doping the first part of the first resistor RA and the second part of the second resistor RB, one or more process variations that may occur during the doping process may have substantially the same or a similar influence on the resistivity or sheet resistance of the first resistor RA and the resistivity or sheet resistance of the second resistor RB. Such process variations may, therefore, have no or a reduced influence on the compensation of the linear and/or quadratic temperature coefficients TC1A, TC2A, TC1B, TC2B of the first and second resistors RA, RB. Expressed differently, a temperature dependency of the resistor circuit may be less sensitive to the one or more process variations. The resistor circuit may be considered to be temperature independent (e.g. substantially temperature independent) and/or insensitive (e.g. substantially insensitive) to the process variations.

By simultaneously doping the first part of the first resistor RA and the second part of the second resistor RB, the resistivity or sheet resistance of the first resistor and the resistivity or sheet resistance of the second resistor may be correlated. Additionally or alternatively, the first and/or quadratic temperature coefficients TC1A, TC2A of the first resistor RA and the linear and/or quadratic temperature coefficients TC1B, TC2B of the second resistor RB may be correlated. In examples where the process variation may cause a lower or decreased dopant concentration in the first part and the second part, the absolute values of the linear and/or quadratic temperature coefficients TC1A, TC2A of the first resistor RA and of the linear and/or quadratic temperature coefficients TC1B, TC2B of the second resistor RB may increase linearly to each other. Additionally, the resistivity or sheet resistance of the first resistor RA and the resistivity or sheet resistance of the second resistor RB may increase, e.g. increase linearly to each other. Alternatively, in examples where the process variation may cause a higher or increased dopant concentration in the first part and the second part, the absolute values of the linear and/or quadratic temperature coefficients TC1A, TC2A of the first resistor RA and of the linear and/or temperature coefficients TC1B, TC2B of the second resistor RB may decrease linearly to each other. Additionally, the resistivity or sheet resistance of the first resistor RA and the resistivity or sheet resistance of the second resistor RB may decrease, e.g. decrease linearly to each other. The sign of the linear temperature coefficient TC1A of the first resistor RA and the sign of the linear temperature coefficient TC1B of the second resistor RB may remain unchanged or unaffected by the increase or decrease in the doping concentration in the first part and the second part. As a result, variations in the linear and/or quadratic temperature coefficients TC1A, TC2A of the first resistor RA and the linear and/or quadratic temperature coefficients TC1B, TC2B of the second resistor RB, the resistivity or sheet resistance of the first resistor RA and/or the resistivity or sheet resistance of the second resistor RB may be equal (or substantially equal) and/or may be compensable.

As will be described below in more detail, the first resistor RA may comprise a plurality of first parts. The second resistor RB may comprise a plurality of second parts. The method may comprise simultaneously doping the first parts and the second parts. The first resistor and the second resistor may be configured such that doping of the plurality of first parts and the plurality of second parts defines the temperature coefficient of the first resistor and the temperature coefficient of the second resistor.

The step of forming the first resistor RA and/or the second resistor RB may comprise selecting one or more parameters of the first resistor RA and/or the second resistor RB, e.g. so that the linear and/or quadratic temperature coefficients TC1A, TC2A of the first resistor RA and the linear and/or quadratic temperature coefficients TC1B, TC2B of the second resistor RB compensate each other, for example when the first resistor RA and the second resistor RB are connected or coupled together. Expressed differently, the parameters of first resistor RA and/or the second resistor RB may be selected such that a temperature dependence of the resistivity or sheet resistance of the first resistor RA and a temperature dependence of the resistivity or sheet resistance of the second resistor RB may be compensated, for example when the first resistor RA and the second resistor RB are connected or coupled together.

The parameters may comprise one or more of: a number of first parts, a first length, a first width, a first thickness of the first parts and a number of second parts, a second length, a second width and a second thickness of the second parts. The parameters may be selected based on a material of the first parts, a material of the second parts, another material of another part of the first and/or the second resistors RA, RB, one or more dopants used to dope the first parts, one or more dopants used to dope the second parts, a grain size of the material of the first and/or second parts and/or a grain size of the other material of the other part of the first and/or second resistors RA, RB. It will be appreciated that in examples where more than one dopant is used, the dopants may be selected such that only one dopant dominates the temperature behaviour of the first and/or second resistors.

The material may comprise a semiconductor material, such as a polycrystalline material and/or a single crystalline material, as will be described below. The other material of the other part of the first and/or second resistors RA, RB may comprise another semiconductor material, such as another polycrystalline material and/or another single crystalline material. The material and the other material may be the same or different.

The parameters of the first and/or second resistors RA, RB may be selected based on a model or other calculations, e.g. prior to forming the first and/or second resistors RA, RB. The model may be used to determine the parameters, e.g. for desired values of the resistivity or sheet resistance of the first and/or second resistors RA, RB, the linear and/or quadratic temperature coefficients TC1A, TC2A of the first resistor RA and/or the linear and/or quadratic temperature coefficients TC1B, TC2B of the second resistor RB. The material of the first and/or second parts, the other material of the other part of the first and/or the second resistor RA, RB, the dopants used to dope the first and second parts, the grain size of the material of the first and/or second parts and/or the grain size of the other material of the other part of the first and/or second resistors RA, RB may be input or used in the calculation or model.

By selecting the parameters of the first resistor RA and/or second resistor RB, the resistivity or sheet resistance of the first resistor RA and/or the resistivity or sheet resistance of the second resistor RB may be changed, varied or adjusted. This may additionally result in a change, variation or adjustment of the linear and/or quadratic temperature coefficients TC1A, TC2A of the first resistor RA and/or the linear and/or quadratic temperature coefficients TC1B, TC2B of the second resistor RB. A change, variation or adjustment in the resistivity or sheet resistance of the first resistor RA, the linear and/or quadratic temperature coefficients TC1A, TC2A of the first resistor RA, the resistivity or sheet resistance of the second resistor RB and/or the linear and/or quadratic temperature coefficients TC1B, TC2B of the second resistor RB may allow for the compensation of the variations, e.g. due to the one or more process variations, which may be equal (or substantially equal), in the resistivity or sheet resistance of the first resistor RA, the resistivity or sheet resistance of the second resistor RB, the linear and/or quadratic temperature coefficients TC1A, TC2A of the first resistor RA and/or the linear and/or quadratic temperature coefficients TC1B, TC2B of the second resistor RB. Additionally or alternatively, the change, variation or adjustment in the resistivity or sheet resistance of the first resistor RA, the linear and/or quadratic temperature coefficients TC1A, TC2A of the first resistor RA, the resistivity or sheet resistance of the second resistor RB and/or the linear and/or quadratic temperature coefficients TC1B, TC2B of the second resistor RB may allow for the compensation of the linear and/or quadratic temperature coefficients of the first resistor RA and the linear and/or quadratic temperature coefficients of the second resistor RB, thereby making the resistor circuit temperature independent, e.g. substantially temperature independent.

The step of selecting the parameters may comprise selecting the parameters of the first resistor such that a length to width ratio of the first parts is about 1. The step of selecting the parameters may comprise selecting the parameters of the second resistor such that a length to width ratio of the second parts is about 0.2. It will be appreciated that a length to width ratio of the first parts is not limited to about 1 and/or that a length to width ratio of the second parts is not limited to about 0.2. In other examples, the length to width ratio of the first parts may be different from about 1 and/or the length to width ratio of the second parts may be different from about 0.2, e.g. depending on the material of the first and/or second parts, the other material of the other part of the first and/or the second resistor, the dopants used to dope the first and second parts, the grain size of the material of the first and/or second parts and/or the grain size of the other material of the other part of the first and/or second resistor.

The step of simultaneously doping the first parts of the first resistor RA and the second parts of the second resistor RB may comprise doping the first parts and the second parts with at least one of: the same dopant or dopants, substantially the same dopant dose and/or concentration, and substantially the same dopant energy. The first parts and/or second parts may be n-doped or p-doped. Exemplary dopants that may be used to n-dope the first parts of the first resistor RA and/or the second parts of the second resistor RB may comprise phosphor (P), arsenic (As), antimony (Sb) or a combination thereof. An exemplary dopant that may be used to p-dope the first parts of the first resistor RA and/or the second parts of the second resistor RB may comprise boron (B). It will be appreciated that the first parts of the first resistor RA and/or the second parts of the second resistor may be n-type and p-type doped. In such examples, a net doping of the first part of the first resistor RA and/or the second part of the second resistor RB may be n-type or p-type.

It will be appreciated that the doping, e.g. a doping concentration, of the first parts of the first resistor RA and the doping of the second parts of the second resistor RB determines or defines a resistivity or sheet resistance of the first resistor and a resistivity or sheet resistance of the second resistor, respectively. For example, the step of simultaneously doping the first parts and the second parts comprises doping the first parts so that the first resistor comprises a sheet resistance of about 20 to 200 $\Omega$/sq, 40 to 150 $\Omega$/sq, 50 to 80 $\Omega$/sq, 10 to 300 $\Omega$/sq, 50 to 250 $\Omega$/sq or 90 to 170 $\Omega$/sq.

In examples, where the first parts of the first resistor RA are n-doped, the sheet resistance of the first resistor RA may be in the range of about 50 to 80 $\Omega$/sq, such as for example about 60 $\Omega$/sq. In examples, where the first parts of the first resistor RA are p-doped, the sheet resistance of the first resistor RA may be in the range of about 90 to 170 $\Omega$/sq. such as for example about 130 $\Omega$/sq. The step of simultaneously doping the first parts and the second parts may comprises doping the second parts so that the second resistor RB comprises a sheet resistance of about 50 to 500 $\Omega$/sq, 100 to 400 $\Omega$/sq, 200 to 400 $\Omega$/sq, or 150 to 45 $\Omega$/sq. In examples, where the second parts of the second resistor RB are n-doped, the sheet resistance of the second resistor RB may be in the range of about 200 to 400 $\Omega$/sq, such as for example about 320 $\Omega$/sq. In examples, where the second parts of the second resistor RB are p-doped, the sheet resistance of the second resistor RB may be in the range of about 220 to 340 $\Omega$/sq, such as for example about 280 $\Omega$/sq. The above values of the sheet resistances may be considered as the sheet resistances determined at room temperature, e.g. about 27° C. It will be appreciated that the first and/or second resistors are not limited to the sheet resistances disclosed herein and that in other examples the first and/or second resistors may comprise a different sheet resistance.

An exemplary method for measuring the sheet resistance of the first resistor RA and/or the second resistor RB may include the van der Pauw method. Other methods for measuring the resistance, e.g. the contact resistance, of the first resistor, e.g. a/the first part, and/or the second resistor, e.g. a/the second part, may comprise the transmission line measurement. This method may additionally or alternatively be used to determine the sheet resistivity of the first resistor and/or the second resistor.

FIG. 2 shows an exemplary process flow of the method of forming the resistor circuit. It will be appreciated that some of the method steps shown in FIG. 2 may be used, in isolation or in combination, to form at least a part of the resistor circuit, such as for example the first resistor RA and/or the second resistor RB. Although the following description refers to a first resistor RA comprising a first part and/or a second resistor RB comprising a second part, it will be appreciated that one or more features and/or method steps described below may also be applied to a resistor circuit (or part thereof) comprising a first resistor comprising the first plurality of first parts and/or a second resistor comprising the second plurality of second parts, or a formation thereof.

The step of forming the first resistor RA and/or second resistor RB may comprise providing a substrate 2. The substrate 2 may comprise a semiconductor material, such as for example silicon (Si). It will be appreciated that in other examples other semiconductor materials, such as for example germanium (Ge), gallium arsenide (GaAs) or silicon carbide (SiC), may be used. The substrate 2 may be provided in the form of a semiconductor wafer, such as for example a single crystal silicon wafer. In this example, the substrate 2 is p-doped. However, it will be appreciated that in other examples, the substrate may be n-doped. The step of forming the first resistor RA and/or the second resistor RB may comprise forming at least one or a plurality of insulating portions in the substrate (step 2005a, 2005b, respectively). For example, the insulating portion 4 or two insulating portions 4a may be formed by etching the substrate 2, e.g. using an patterning and/or etching process, and subsequently depositing an oxide or field oxide, such as for example silicon dioxide, silicon oxynitride (SiON) or another material having a permittivity lower than silicon, e.g. to fill the etched portions of the substrate 2. Although two insulating portions are formed in step 2005a in FIG. 2, it will be appreciated that in other examples more than two insulating portions may be formed in or on the substrate.

The insulating portion 4 or the two insulating portions 4a may be formed using a shallow trench isolation (STI) process. Alternatively, the insulating portion 4 or the two insulating portions 4a may be formed using a local oxidation process, such as for example local oxidation of silicon (LOCOS).

The step of forming the first resistor RA may comprise forming a well region 6 (2010a). The well region 6 may be formed prior or subsequent to the step of forming the two insulating portions 4a (step 2005a). It will be appreciated that in examples where two insulating portions 4a are formed subsequent to the step of forming the well region 6, at least a part of each of the two insulating portion 4a may be formed in or on the well region 6. The well region 6 may be formed in the substrate 2, e.g. using a doping method such as for example ion implantation. In other words, the well region 6 may be formed by doping a portion of the substrate 2, e.g. so that the doping concentration in the well region 6 is higher than in the remaining and/or surrounding parts of the substrate 2. In this example, the well region 6 may be p-doped. However, it will be appreciated that in other examples, the well region may be n-doped. The well region 6 may be formed in the substrate 6, for example, so as to extend between the two insulating portions 4a. The first part 8 of the first resistor RA (which is indicated by a dashed line in step 2010a of FIG. 2) may be comprised in or defined by at least a part of the well region 6. For example, the first part 8 of the first resistor RA may be comprised in or defined by the part 6a of the well region 6 that is proximal to a surface of the well region 6. It will be appreciated that in other examples the first part of the first resistor may be comprised in or defined by another part of the well region.

The step of forming the second resistor RB may comprise depositing a semiconductor material on the insulating portion 4, e.g. to define or form the second part 10 of the second resistor RB (step 2010b). The semiconductor material may comprise a semiconductor material that changes its temperature coefficient when being doped. In this example, the semiconductor material comprises a polycrystalline semiconductor material, such as for example polycrystalline silicon. The polycrystalline silicon may be deposited using a low pressure chemical vapour (LPCVD) process, e.g. using Silane ($SiH_4$) as a starting or precursor material. The formation of the second part 10 of the second resistor RB may additionally include a patterning or lithographic process and/or an etching process. It will be appreciated that in other examples the semiconductor material may comprise germanium (Ge) or a III-V compound semiconductor material.

As described above, the method comprises simultaneously doping the first part 8 of the first resistor RA and the second part 10 of the second resistor RB (step 2015a, 2015b), e.g. using a doping method such as for example ion implantation or shallow ion implantation. The doping, e.g. the step of doping, of the first part 8 and the second part 10 defines the linear and/or quadratic temperature coefficients TC1A, TC2A of the first resistor RA and the linear and/or quadratic temperature coefficients TC1B, TC2B of the second resistor RB. The linear temperature coefficient TC1A of the first resistor RA and the linear temperature coefficient TC1B of the second resistor RB have opposite signs, as described above. The opposite signs of the linear temperature coefficient TC1A of the first resistor RA and the temperature coefficient TC1B of the second resistor RB may be due to the first configuration or arrangement of the first resistor RA and the second configuration or arrangement of the second resistor RB being different, as will be described below. The dopant or dopants may be selected so that the type of doping of the first part 8 and the second part 10 is opposite to the doping of the well region 6 and/or the substrate 2. In this example, the first part 8 of the first resistor RA and the second part 10 of the second resistor RB may be n-doped. It will be appreciated that in other examples, the first part of the first resistor and the second part of the second resistor may be p-doped. The step of simultaneously doping the first part 8 of the first resistor RA and the second part 10 of the second resistor RB may comprise doping the first part 8 and the second part 10 in the same implantation step, e.g. in the same implantation chamber at the same time. As described above, the same dopant or dopants, dopant dose or concentration and/or dopant energy may be used to dope the first part 8 and the second part 10. The step of simultaneously doping the first part 8 of the first resistor RA and the second part 10 of the second resistor RB may be repeated with a different dopant or dopants, dopant energy and/or dopant dose or concentration. Alternatively, the step of simultaneously doping the first part 8 of the first resistor RA and the second part 10 of the second resistor RB may be repeated with the same dopant or dopants, dopant energy and/or dopant dose or concentration.

The method may comprise heating at least the first part 8 and/or the second part 10, e.g. to thermally activate the dopant(s) and/or to distribute the dopant(s) in the first part 8 and/or the second part 10. This step may comprise heating the first part 8 and/or the second part 10 to a temperature of about 1200° C. It will be appreciated that in other examples, the first and/or second parts may be heated to a temperature higher or lower than about 1200° C. to activate the dopant(s), e.g. depending on the dopant(s) and/or the material of the first and/or second parts.

The method may comprise forming one or more contacts, such as for example electrical contacts, on the first part 8 and/or second part 10 for connecting, such as electrically connecting or coupling, the first resistor RA and the second resistor RB to one another other. In FIG. 2, two contacts 12a, 12b are formed on each of the first part 8 and the second part 10, such as for example on each end or end portion thereof. The contacts 12a, 12b may be arranged at a distance of or space from each other. The space or distance between the contacts 12a, 12b may define a length of the first part 8 and/or the second part 10, as will be described below. The contacts 12a, 12b may be formed from a metal or transition metal, such as for example tungsten (W) or cobalt (Co). The contacts 12a, 12b may be formed using a deposition process, such as for example physical vapour deposition. In examples, where the first part 8 and/or second part 10 comprise silicon and/or polycrystalline silicon and the contacts 12a, 12b comprise tungsten, a silicide process may be additionally used to at least partly bond the contacts 12a, 12b to the first part 8 and/or second part 10. It will be appreciated that in some examples the first resistor and/or the second resistor may be each or both connected to another resistor or device.

Figure 3A:
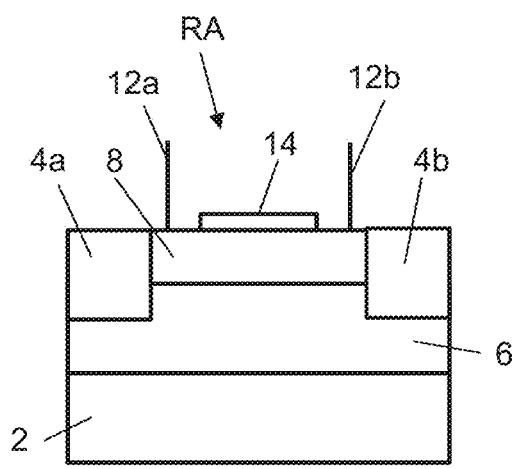
FIG. 3A schematically depicts an example of a first resistor, which was formed using the method of FIGS. 1 and/or 2.
Figure 3B:
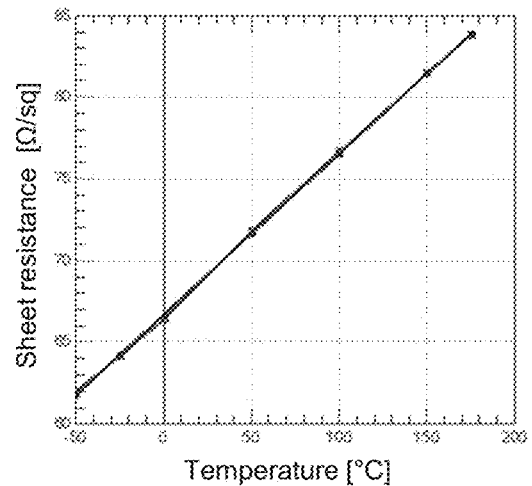
FIG. 3B depicts a graph of the sheet resistance of the first resistor of FIG. 3A in dependence on temperature.
Figure 3C:
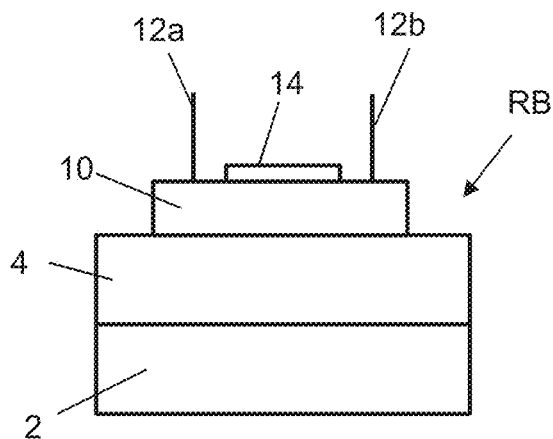
FIG. 3C schematically depicts an example of a second resistor, which was formed using the method of FIGS. 1 and/or 2.
Figure 3D:
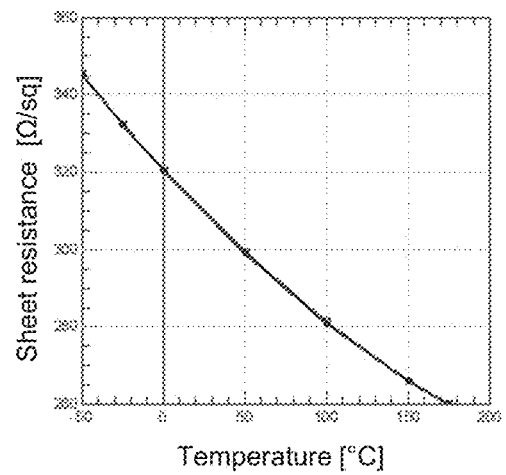
FIG. 3D depicts a graph of the sheet resistance of the second resistor of FIG. 3C in dependence on the temperature.

FIG. 3A shows an example of the first resistor RA, which was formed using the method described above in relation to FIGS. 1 and 2. FIG. 3B shows a graph of the sheet resistance (the dots represent measured data and the line represents simulated data) of the first resistor RA in dependence on the temperature. FIG. 3C shows an example of the second resistor RB, which was formed using the method described above in relation to FIGS. 1 and 2. FIG. 3D shows a graph of the sheet resistance (the dots represent measured data and the line represents simulated data) of the second resistor RB in dependence on the temperature.

As described above, the first resistor RA is or comprises a first type of resistor. The second resistor RB is or comprises a second type of resistor, which is different from the first type of resistor. In this example, the first resistor RA comprises a diffusion resistor and the second resistor RB comprises a polycrystalline resistor.

It can be seen from FIG. 3B that the sheet resistance of the first resistor RA increases with increasing temperature. Therefore, the linear temperature coefficient TC1A of the first resistor RA may be considered as positive, as described above. In semiconductor materials two mechanisms may influence the resistivity of the semiconductor material. A first mechanism may be charge carrier generation, e.g. extrinsic and/or intrinsic charge carrier generation, in which charge carriers may become thermally activated and flow in the conduction and/or valence band. A second mechanism may be the interaction between phonons and charge carriers. The increase in sheet resistance of the first resistor RA with increasing temperature may be due to an increase in interactions, such as for example collisions, between charge carriers and phonons present in the first part 8 with increasing temperature. The interactions with phonons may be the dominant mechanism in the temperature range of about −50 to 200° C., as the extrinsic charge carriers from the dopants, e.g. acceptors and/or donors, in the first resistor RA, e.g. the first part 8 thereof, are already thermally activated and/or diffused.

As can be seen from FIG. 3D, the sheet resistance of the second resistor RB decreases with increasing temperature. Therefore, the linear temperature coefficient TC1B of the second resistor RB may be considered as negative. The interactions with phonons may be the dominant mechanism in the temperature range of about −50 to 200° C. in the grains of the polycrystalline silicon, e.g. in the second part 10 of the second resistor RB. However, additional conductions paths may exist along the boundaries of the grains. The additional conductions paths increase with increasing temperature resulting in an increase of the mobility of the charge carriers. The increase in the mobility results in a decrease of the resistivity or sheet resistance of the second resistor RB due to the resistivity being inversely proportional to the mobility. It will be appreciated that in some examples the sign of the linear temperature coefficient of the second resistor may change from positive to negative with increasing temperature, depending on the grain size of the polycrystalline silicon and the dopant, dopants and/or dopant concentration or dose.

The first resistor RA and/or the second resistor RB may comprise a further insulating portion 14. The further insulating portion 14 may be deposited on the first part 8 of the first resistor RA and/or the second part 10 of the second resistor RB, e.g. between the two contacts 12a, 12b, as shown in FIGS. 3A and 3C. The further insulating portion 14 may be deposited on the first part 8 and/or the second part 10 to protect the first part 8 and/or the second part 10, e.g. during further method or process steps, such as for example during the deposition of metal. The further insulating 14 portion may comprise an insulating material, such as for example a resist protective oxide (RPO Ox).

Figure 3E:
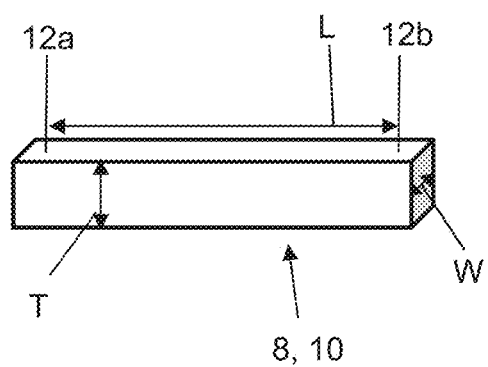
FIG. 3E depicts a schematic representation of the first part of the first resistor of FIG. 3A and/or the second part of the second resistor of FIG. 3C.

FIG. 3E shows a schematic representation of the first part 8 of the first resistor RA and/or the second part 10 of the second resistor RB. In FIG. 3E, the first width or the second width is indicated as W and the first thickness or the second thickness is indicated as T. The first length may comprise a first effective length and/or the second length may comprise a second effective length, which is indicated in FIG. 3E as L. The first and/or the second effective length L may be considered as the distance or space between the contacts 12a, 12b on the first part 8 or the second part 10, respectively. As described above, the parameters of the first resistor RA and/or the second resistor RB may be selected such that the length to width ratio (L/W) of the first part 8 is about 1 and/or the length to width ratio (L/W) of the second part 10 is about 0.2.

Figure 4A:
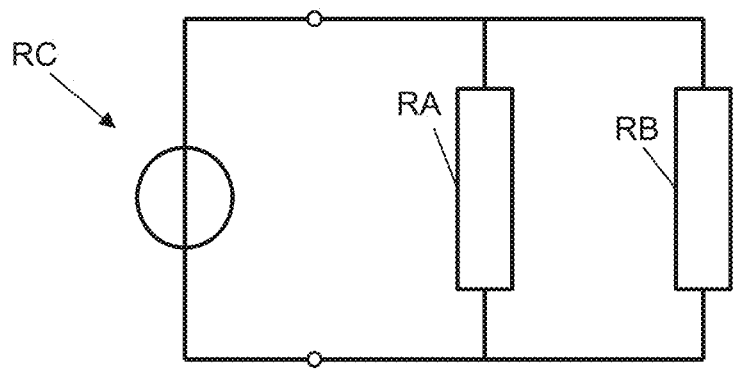
FIG. 4A depicts an example of a resistor circuit formed at least partially using the method of FIGS. 1 and/or 2.

FIG. 4A shows an example of a resistor circuit RC formed at least partially using the method described above in relation in FIGS. 1 and 2. In addition, to the steps described above, the method may comprise connecting or coupling the first resistor RA and the second resistor RB to one another such that the linear and/or quadratic temperature coefficients TC1A, TC2A of the first resistor RA and the linear and/or quadratic coefficients TC1B, TC2B of the second resistor RB compensate, e.g. at least partially or substantially compensate, each other, as will be described below. For example, the method may comprise connecting the first resistor RA and the second resistor RB in parallel. In the example shown in FIG. 4A, the first part 8 and the second part 10 are n-doped, as described above.

Figure 4B:
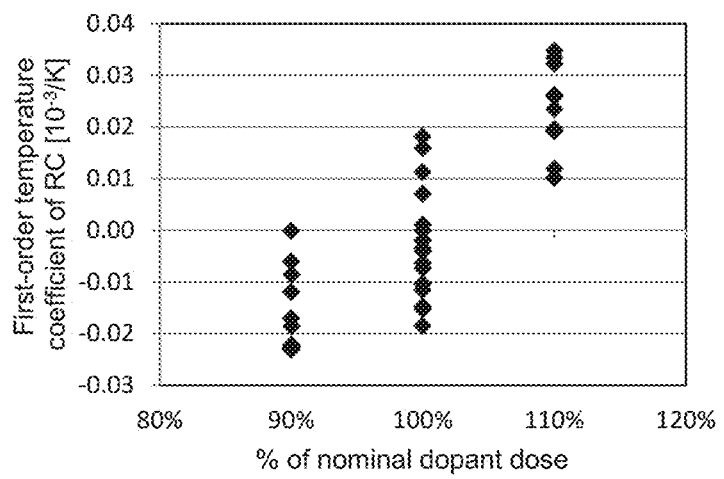
FIG. 4B depicts a graph of the first-order temperature coefficient of the resistor circuit of FIG. 4A in dependence on varying dopant doses.

FIG. 4B shows a graph of the first-order temperature coefficient of the resistor circuit RC resulting from connecting the first and second resistors RA, RB to one another, as shown in FIG. 4A, in dependence on varying dopant doses. The varying dopant dose may also be understood as a percentage of a nominal dopant dose, which may be used in the method described above in relation to FIGS. 1 and 2. From FIG. 4B it can be that the first-order temperature coefficient of the resistor circuit RC may range from about $-0.025 \times 10^{-3}$ to about $0.035 \times 10^{-3}$ 1/K, depending on the dopant dose. A variation of the first-order temperature coefficient of the resistor circuit RC for the varying dopant doses may be considered to be very low. This may be due to the correlation between the linear temperature coefficients TC1A, TC1B and/or the sheet resistances of the first and second resistors RA, RB. Additionally or alternatively, it can be seen from FIG. 4B that by connecting the first resistor and the second resistor RA, RB in parallel, the linear temperature coefficient TC1A of the first resistor RA and the linear temperature coefficients TC1B of the second resistor RB may be compensated (e.g. substantially compensated). This may allow for the resistor circuit to be considered as a substantially temperature independent resistor, as described above.

Figure 4C:
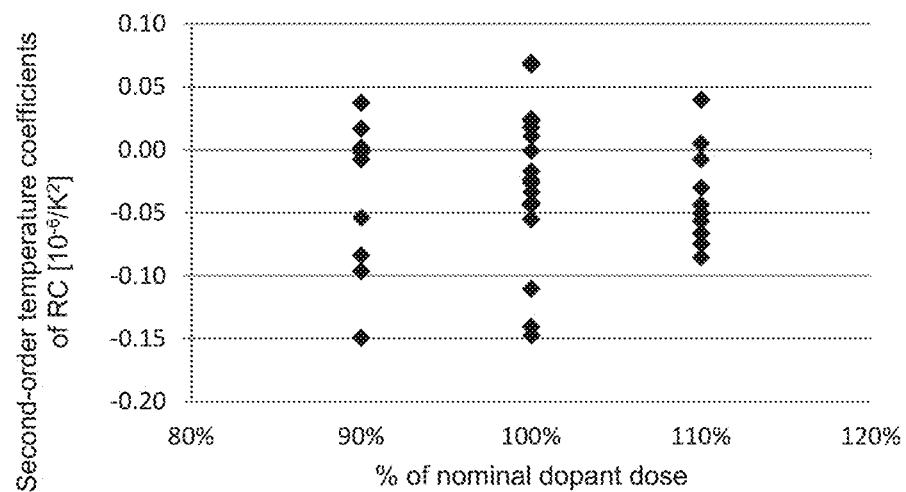
FIG. 4C depicts a graph of the second-order temperature coefficient of the resistor circuit of FIG. 4A in dependence on varying dopant doses.

FIG. 4C shows a graph of the second-order temperature coefficients of the of the resistor circuit RC resulting from connecting the first and second resistors RA, RB to one another in dependence on varying dopant doses. It can be seen from FIG. 4C that the second-order temperature coefficient of the resistor circuit RC may range from about $-0.15 \times 10^{-8}$ to about $0.6 \times 10^{-8}$ 1/K². In other words, by connecting the first resistor RA and the second resistor RB in parallel, the quadratic temperature coefficient TC2A of the first resistor RA and the quadratic temperature coefficient TC2B of the second resistor RB may also be compensated (e.g. substantially compensated).

Experiments have shown that in examples where the first resistor RA and the second resistor RB are connected in parallel, the change of the sheet resistance ΔR of the resistor circuit RC over a change of the temperature ΔT is about 8 ppm/K for a nominal dopant dose. In this example, the sheet resistance of the resistor circuit RC was determined as about 114 Ω/sq, the first-order temperature coefficient of the resistor circuit RC was determined as substantially zero and the second-order temperature coefficient of the resistor circuit RC was determined as about $-0.03 \times 10^{-6}$ 1/K² for a nominal dopant dose. As such, the resistor circuit RC may be considered to be substantially temperature independent.

The method described above may comprise forming a third resistor RD. A temperature coefficient of the third resistor RD may comprise a linear or first-order temperature coefficient TC1D. The temperature coefficient of the third resistor RD may comprise a quadratic or second-order temperature coefficient TC2D.

The linear and/or quadratic temperature coefficients TC1D, TC2D of the third resistor RD may be different from at least one of the linear and/or quadratic temperature coefficients TC1A, TC2A of the first resistor RA and the linear and/or quadratic temperature coefficients TC1B, TC2B of the second resistor RB. The linear temperature coefficient TC1D of the third resistor RD may be positive or negative. The method may comprise doping the third part of the third resistor RD at the same time as the first part 8 of the first resistor RA and the second part 10 of the second resistor RB. The third resistor RD may be configured such that doping the third part of the third resistor RD defines the linear and/or quadratic temperature coefficients TC1D, TC2D of the third resistor RD. Expressed differently, the method may comprise simultaneously doping of the first, second and third parts of the first, second and third resistors RA, RB, RD, respectively. The third resistor RD may be the same or same type as the first resistor RA or the second RB. As such, the method steps of forming the third resistor RD may be the same as the method steps of forming the first resistor RA and/or the second resistor RB. It will be appreciated that the parameters of the third resistor RD may be the same or different from the parameters of the first and/or second resistors RA, RB. For example, a length to width ratio of the third part of the third resistor RD may be different from a length to width ratio of the first and/or second resistors RA, RB.

Figure 5A:
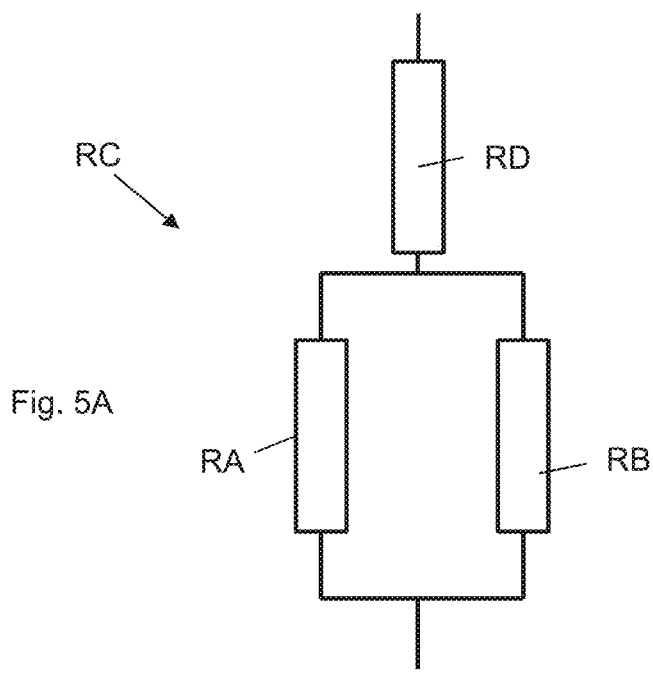
FIG. 5A depicts an example of another resistor circuit formed at least partially using the method of FIGS. 1 and/or 2.

FIG. 5A shows an example of another resistor circuit RC formed at least partially using the method described above in relation in FIGS. 1 and 2. In addition, to the steps described above, the method may comprise connecting the third resistor RD to the first resistor RA and the second resistor RB, for example such that the linear and/or quadratic temperature coefficients TC1A, TC2A of the first resistor RA, the linear and/or quadratic temperature coefficients TC1B, TC2B of the second resistor RB and the linear and/or quadratic temperature coefficients TC1D, TC2D of the third resistor RD compensate (e.g. substantially compensate) each other. For example, the method may comprise connecting the third resistor RD in series with the first resistor RA and the second resistor RB, which are connected in parallel. In the example shown in FIG. 5A, the first resistor RA comprises a diffusion resistor, the second resistor RB comprises a polycrystalline resistor and the third resistor RD comprises a polycrystalline resistor. It will be appreciated that in other examples the third resistor may comprise a diffusion resistor. The first part 8 of the first resistor RA, the second part 10 of the second resistor RB and the third part of the third resistor RD are n-doped. However, it will be appreciated that in other examples, the first part of the first resistor, the second part of the second resistor and the third part of the third resistor may be p-doped.

Figure 5B:
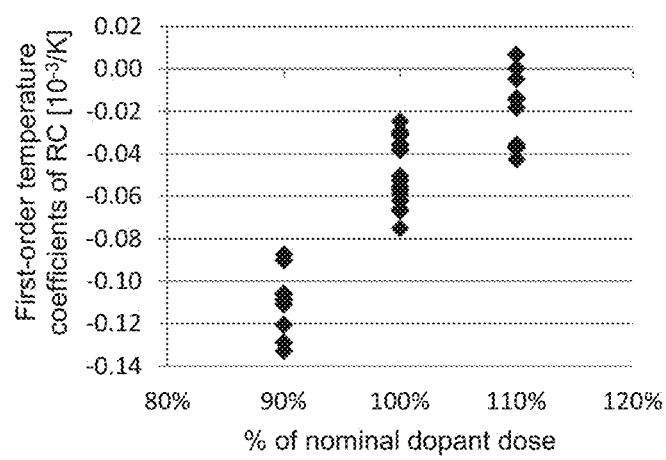
FIG. 5B depicts a graph of the first-order temperature coefficient of the resistor circuit of FIG. 5A in dependence on varying dopant doses.

FIG. 5B shows a graph of the first-order temperature coefficient of the resistor circuit RC resulting from connecting the first, second and third resistors RA, RB, RD, as described above, in dependence on varying dopant doses. From FIG. 5B it can be that the first-order temperature coefficient of the resistor circuit RC may range from about $0.01 \times 10^{-3}$ to about $-0.13 \times 10^{-3}$ 1/K. In other words, by connecting the third resistor RD to the first and second resistors RA, RB, which are connected in parallel, the linear temperature coefficients TC1A, TC1B, TC1D of the first, second and third resistors RA, RB, RD may be compensated (e.g. substantially compensated).

Figure 5C:
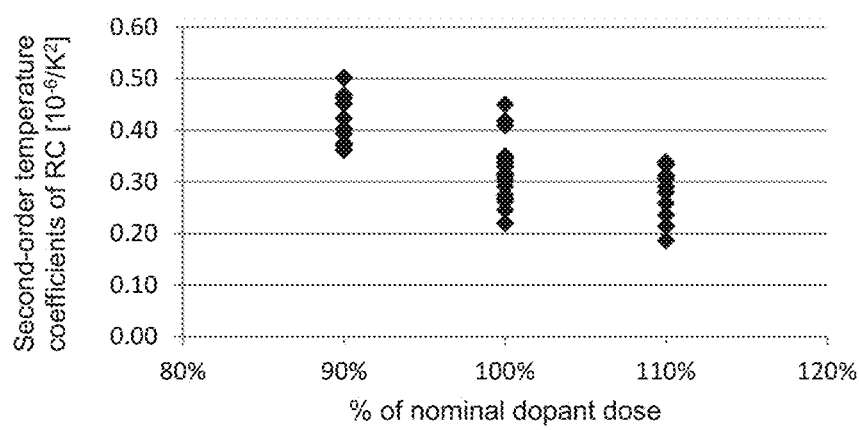
FIG. 5C depicts a graph of the second-order temperature coefficient of the resistor circuit of FIG. 5A in dependence on varying dopant doses.

FIG. 5C shows a graph of the second-order temperature coefficient of the resistor circuit RC resulting from connecting the first, second and third resistors RA, RB, RD, as described above, in dependence on varying dopant doses. From FIG. 5C it can be seen that the second-order temperature coefficient of the resistor circuit RC may range from about $0.2 \times 10^{-6}$ to about $0.5 \times 10^{-6}$ 1/K². In other words, by connecting the third resistor RD to the first and second resistors RA, RB, which are connected in parallel, the quadratic temperature coefficients TC2A, TC2B, TC2D of the first, second and third resistors RA, RB, RC may be compensated (e.g. substantially compensated). As such, the resistor circuit shown in FIG. 5A to may be considered as a substantially temperature independent resistor.

Experiments have shown that in examples where the third resistor RD is connected to the first and second resistors RA, RB, which are connected in parallel, as described above, the change of the sheet resistance ΔR of the resistor circuit RC over a change of the temperature ΔT is about 19 ppm/K for a nominal dopant dose. In this example, the sheet resistance of the resistor circuit RC was determined as about 188 Ω/sq, the first-order temperature coefficient of the resistor circuit RC was determined as about $-0.05 \times 10^{-3}$ 1/K and the second-order temperature coefficients of the resistor circuit was determined as about $0.3 \times 10^{-6}$ 1/K$^2$ for a nominal dopant dose. As such, the resistor circuit RC shown in FIG. 5A may also be considered to be substantially temperature independent.

By forming the third resistor RD and connecting the third resistor to the first and second resistors RA, RB, as described above, an area of the resistor circuit RC may be reduced. This may be due to an increase in resistance of the resistor circuit RC, when the third resistor RD is connected in series to the first and second resistors RA, RB, as described above. In this example, a length to width ratio for the second resistor RB, e.g. the second part 10a may be about 6.2 times of a length to width ratio of the third resistor RD, e.g. the third part, and/or a length to width ratio of the first resistor RA, e.g. the first part 8a, may be about 9.8 times of a length to width ratio of the third resistor RD, e.g. the third part.

Figure 6A:
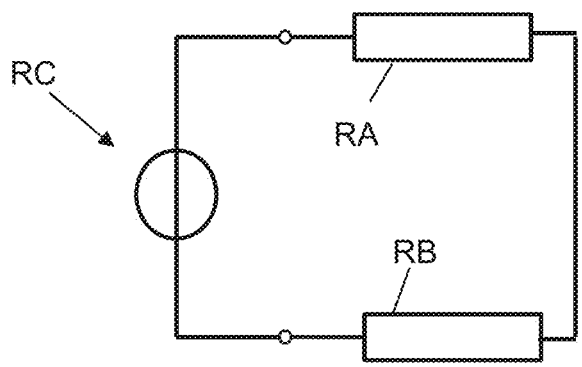
FIG. 6A depicts an example of another resistor circuit formed at least partially using the method of FIGS. 1 and/or 2.

FIG. 6A shows an example of a resistor circuit RC formed at least partially using the method described above in relation in FIGS. 1 and/or 2. In addition, to the steps described above, the method may comprise connecting or coupling the first resistor RA and the second resistor RB in series. In the example shown in FIG. 6A, the first part 8 and the second part 10 are n-doped, as described above.

Figure 6B:
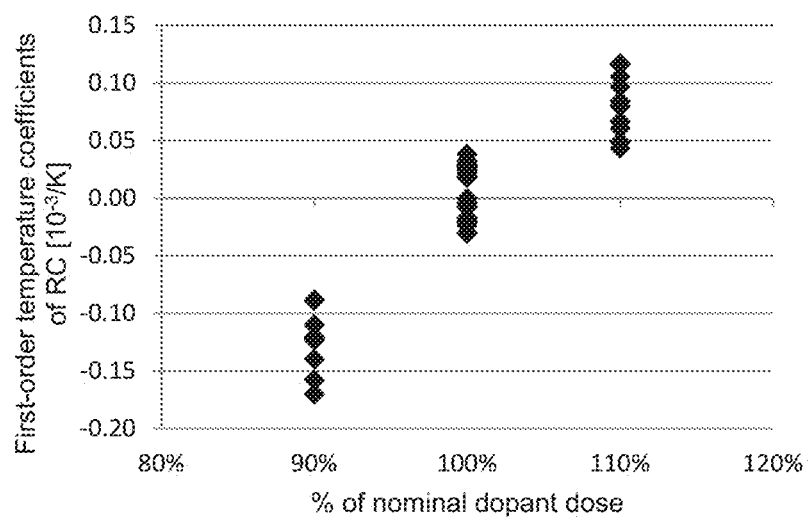
FIG. 6B depicts a graph of the first-order temperature coefficient of the resistor circuit of FIG. 6A in dependence on varying dopant doses.

FIG. 6B shows a graph of the first-order temperature coefficient of the resistor circuit RC resulting from connecting the first and second resistors RA, RB to one another, as shown in FIG. 6A, in dependence on varying dopant doses. From FIG. 6B it can be that the first-order temperature coefficient of the resistor circuit RC may range from about $-0.15 \times 10^{-3}$ to about $0.1 \times 10^{-3}$ 1/K, depending on the dopant dose. A variation of the first-order temperature coefficient of the resistor circuit RC for the varying dopant doses may be considered to be very low. This may be due to the correlation between the linear temperature coefficients TC1A, TC1B and/or the sheet resistances of the first and second resistors RA, RB. Additionally or alternatively, it can be seen from FIG. 6B that by connecting the first resistor and the second resistor RA, RB in series, the linear temperature coefficient TC1A of the first resistor RA and the linear temperature coefficients TC1B of the second resistor RB may be compensated (e.g. substantially compensated).

Figure 6C:
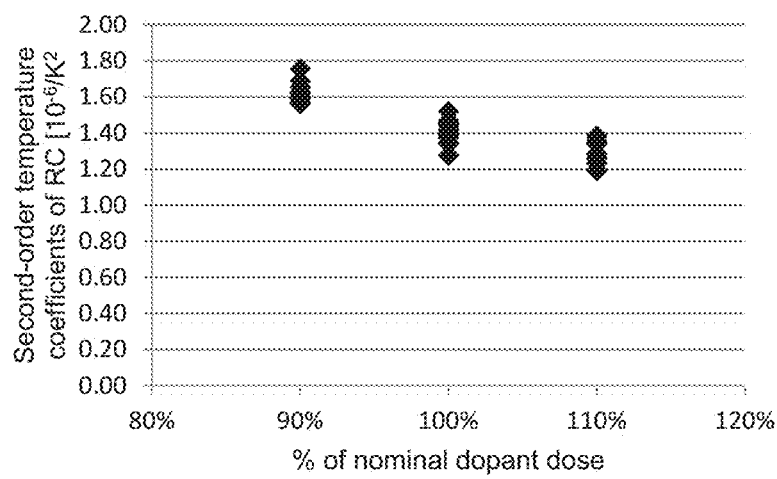
FIG. 6C depicts a graph of the second-order temperature coefficient of the resistor circuit of FIG. 6A in dependence on varying dopant doses.

FIG. 6C shows a graph of the second-order temperature coefficients of the of the resistor circuit RC resulting from connecting the first and second resistors RA, RB to one another, as shown in FIG. 6A, in dependence on varying dopant doses. It can be seen from FIG. 6C that the second-order temperature coefficient of the resistor circuit RC may range from about $1.3 \times 10^{-6}$ to about $1.7 \times 10^{-6}$ 1/K$^2$. In other words, the resistor circuit RC may be considered as comprising a temperature dependence, e.g. a low or reduced temperature dependence.

Experiments have shown that in examples where the first resistor RA and the second resistor RB are connected in series, the change of the sheet resistance ΔR of the resistor circuit RC over a change of the temperature ΔT is about 224 ppm/K for a nominal dopant dose. In this example, the sheet resistance of the resistor circuit RC was determined as about 130 Ω/sq, the first-order temperature coefficient of the resistor circuit RC was determined as substantially zero and the second-order temperature coefficient of the resistor circuit RC was determined as about $1.4 \times 10^{-6}$ 1/K$^2$ for a nominal dopant dose.

Experiments have shown that in examples, where the first part of the first resistor and the second part of the second resistor were p-doped and the first and second resistors were connected in series, the second-order temperature coefficient of the resistor circuit may be lower than the second-order temperature coefficient shown in FIG. 6C. In examples where the first part of the first resistor and the second part of the second resistor were p-doped and the first and second resistors were connected in series, the change of the sheet resistance ΔR of the resistor circuit over a change of the temperature ΔT is about 105 ppm/K for a nominal dopant dose. In such examples, the sheet resistance of the resistor circuit was determined as about 274 Ω/sq, the first-order temperature coefficient of the resistor circuit was determined as substantially zero and the second-order temperature coefficient of the resistor circuit was determined as about $0.7 \times 10^{-6}$ 1/K$^2$ for a nominal dopant dose.

Experiments have shown that in examples where the resistor circuit comprises a single resistor, such as for example a single polycrystalline resistor, as shown in FIG. 3C, the change of the sheet resistance ΔR of the resistor circuit over a change of the temperature ΔT is about 30 ppm/K for a nominal dopant dose. The sheet resistance of the resistor circuit was determined as about 290 Ω/sq, the first-order temperature coefficient of the resistor circuit was determined as about $-0.1 \cdot 10^{-3}$/K and the second-order temperature coefficient of the resistor circuit was determined as about $0.7 \times 10^{-6}$ 1/K$^2$ for a nominal dopant dose. The resistor circuit comprising the single polycrystalline resistor may be considered as a low-temperature coefficient resistor circuit. Expressed differently, the resistor circuit may be considered as comprising a low temperature dependence. However, as described above, the temperature coefficients (e.g. the first-order and second-order temperature coefficients) of the resistor circuits RC shown in FIGS. 4A and 5A are even lower than the temperature coefficients of the resistor circuit comprising the single polycrystalline resistor. As such, the resistor circuits RC described in relation to FIGS. 4A and/or 5A may be considered as comprising an improved temperature dependence. This may be due to the reduced influence of process variations, as described above.

Although the above description in relation to FIGS. 2 to 6C refers to a first resistor comprising one first part and/or one second resistor a second part, it will be appreciated that in other examples the first resistor and/or the second resistor may comprise more than one first part, such as a plurality of first parts, and/or more than one second part, such as a plurality of second parts, respectively. Any of the method steps and/or features described above may also be applicable to a resistor circuit (or a part thereof) comprising a first resistor comprising a plurality of first parts and a second resistor comprising a plurality of second parts, or the formation thereof.

Figure 7A:
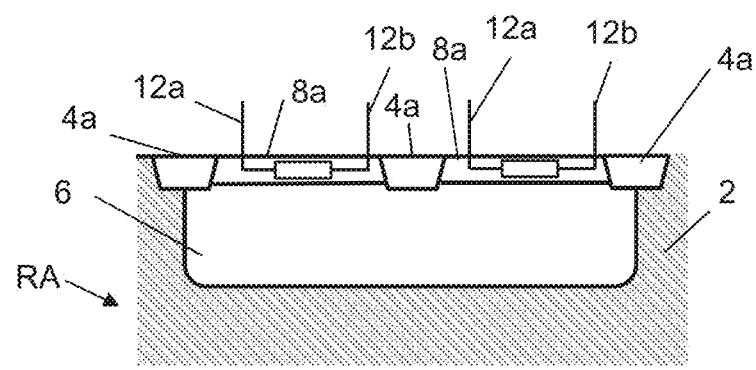
FIG. 7A depicts an exemplary first resistor comprising a plurality of first parts.

FIG. 7A shows an exemplary first resistor RA comprising two first parts 8a. It will be appreciated that in other examples the first resistor may comprise more or less than two first parts. The first resistor RA shown in FIG. 7A is similar to the first resistor shown in FIG. 2.

As described above, the step of forming the first resistor RA may comprise providing the substrate 2. The step of forming the first resistor RA may comprise forming a plurality of insulating portions 4a on or in the substrate 2. Although three insulating portion 4a are shown in FIG. 7A, it will be appreciated that in other examples more or less than three insulating portions may be formed in or on the substrate.

The step of forming the first resistor RA may comprise forming the well region 6 in the substrate 2, as described above. The first parts 8*a* may be comprised in or defined by a plurality of parts of the well region 6, e.g. a plurality of parts of the well region proximal to the surface of the well region 6.

Figure 7B:
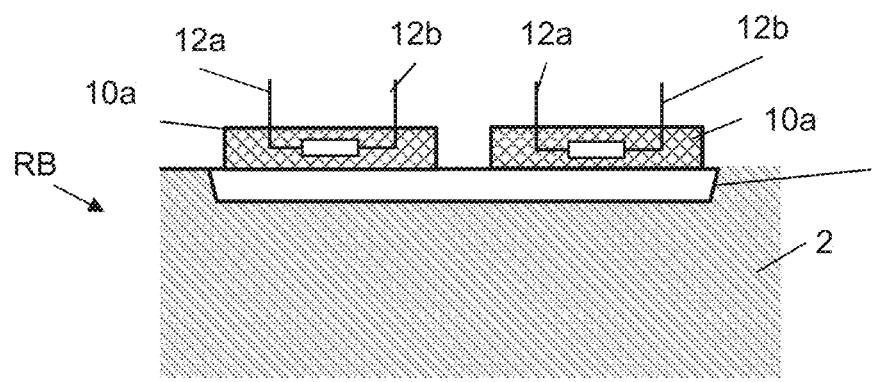
FIG. 7B depicts an exemplary second resistor comprising a plurality of second parts.

FIG. 7B shows an exemplary second resistor comprising two second parts 10*a*. It will be appreciated that in other examples the second resistor may comprise more or less than two second parts.

As described above, the step of forming the second resistor RB may comprise providing the substrate 2. The step of forming the second resistor RA may comprise forming an insulating portion 4 on or in the substrate 2. The step of forming the second resistor RB may comprise depositing the material, e.g. the semiconductor material, on the insulating portion 4, e.g. to form the second parts 10*a* (two of which are shown in FIG. 7B). The second parts 10*a* may be formed on the insulating portion 4 so as to be spaced apart from each other and/or electrically insulated from each other. Although FIG. 7B shows two second parts formed on the insulating portion, it will be appreciated that in other examples more or less than two second parts may be formed on the insulating portion and/or each second part may be formed on a respective insulating portion.

Figure 7C:
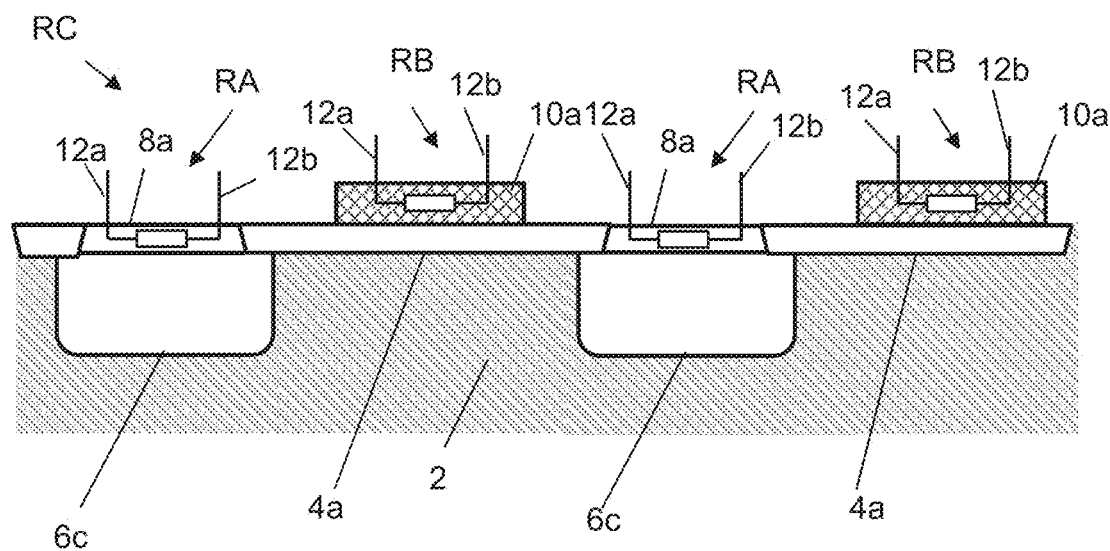
FIG. 7C depicts an example of a resistor circuit comprising the first resistor of FIG. 7A and the second resistor of FIG. 7B.

FIG. 7C shows an example of a resistor circuit RC or at least a part thereof. In this example, the first resistor RA and second resistor RB are formed in or on the same substrate 2. In this example, the first resistor RA comprises two first parts 8*a* and the second resistor RB comprises two second parts 10*a*. However, it will be appreciated that in other examples the first resistor may comprise more or less than two first parts and/or the second resistor may comprise more or less than two second parts. In this example, each first part 8*a* is arranged adjacent a second part 10*a*, or vice versa. In other words, the first and second parts 8*a*, 10*a* are alternately arranged.

The step of forming the first resistor RA and/or the second resistor RB may comprise forming a plurality of insulating portions 4*a* on or in the substrate 2. The insulating portions 4*a* may be arranged or formed, e.g. so as to electrically insulate the first and second parts 8*a*, 10*a* from each other. The insulating portions 4*a* may be arranged to be spaced or at a distance from one another. The insulating portions 4*a* may be arranged so that at least one insulating portion 4*a* extends between the two first parts 8*a* of the first resistor RA.

In this example, the step of forming the first resistor RA may comprise forming two well regions 6*c* in the substrate 2. Each well region 6*c* may extend between two insulating portions 4*a*. Each first part 8*a* may be associated with, comprised in and/or defined by at least a part respective well region 6*c*, such as for example a part that is proximal to the surface of the respective well region 6*c*. Although FIG. 7C shows two well regions 6*c*, it will be appreciated that in other examples, only one well region may be formed. In such examples, the well region may extend below the second parts and/or between two outer insulating portions on or in the substrate. Expressed differently, in such examples, the first parts may be comprised in or defined by a plurality of parts of the well region, e.g. a plurality of parts of the well region proximal to the surface of the well region. It will be appreciated that in other examples, more than one or two well regions may be formed.

The step of forming the second resistor RB may comprise depositing the material, e.g. the semiconductor material, on the/each insulating portion 4*a*, e.g. to form the second parts 10*a*. The/each second part 10*a* may be formed on a respective insulating portion 4*a*.

Referring to FIGS. 7A to 7C, the method may comprise simultaneously doping the first parts 8*a* and the second parts 10*a*, as described above.

The method may comprise forming one or more contacts 12*a*, 12*b* on each first part 8*a* and on each second part 10*a*. The contacts 12*a*, 12*b* may be formed for connecting, e.g. electrically connecting, the first part 8*a* to one another and/or the second parts 10*a* to one another 10*a*. Alternatively, the contacts may be formed for connecting, e.g. electrically connecting, at least one/each first part 8*a* to a second part 10*a*, as will be described below. The contact 12*a*, 12*b* may be formed on an end or end portion of the/each first part 8*a* and/or the/each second parts 10*a*.

Referring to FIG. 7A to 7C, in this example the first resistor RA may be provided in the form of a diffusion resistor and the second resistor RB may be provided in the form of a polycrystalline resistor.

Figure 8A:
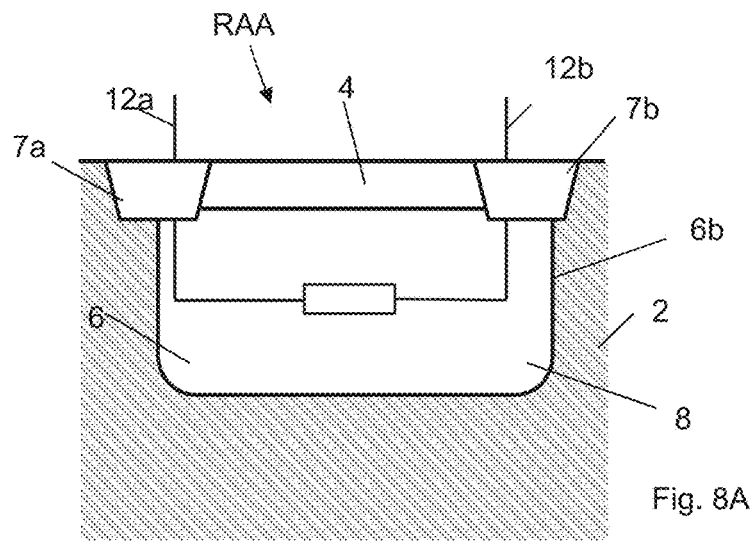
FIG. 8A depicts another exemplary first resistor.

FIG. 8A shows an example of another first resistor RAA. In this example, the other first resistor RAA is provided in the form of a well resistor. The other first resistor RAA may be formed in a similar manner as the first resistor RA, for example using at least some or all of the steps of the method described in relation to FIGS. 1 and/or 2. In other words, any features and/or method steps described in relation to FIGS. 1 and/or 2 may also apply to the other first resistor RAA, e.g. the formation of the other first resistor RAA.

Figure 8B:
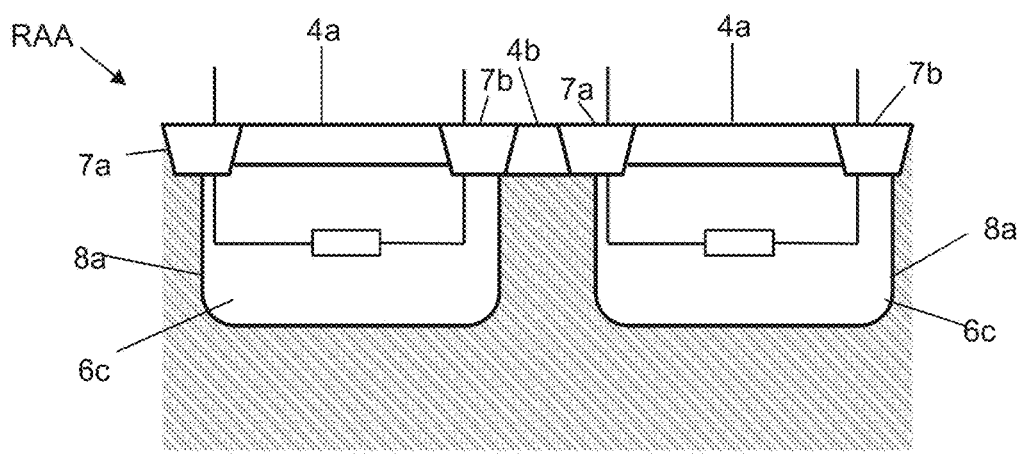
FIG. 8B depicts the first resistor of FIG. 8A comprising a plurality of first parts.
Figure 8C:
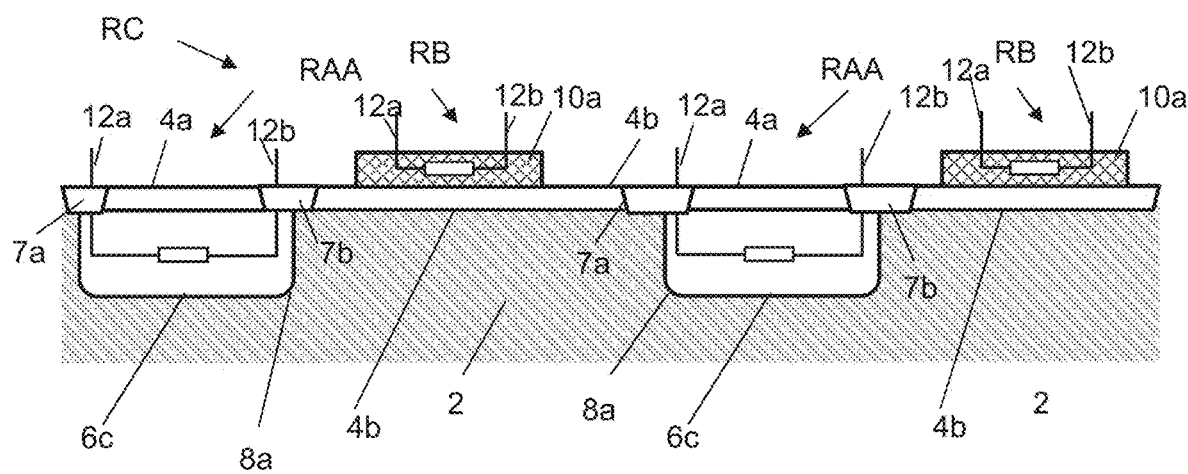
FIG. 8C depicts an example of a resistor circuit comprising the first resistor of FIG. 8B and the second resistor of FIG. 7B.

FIG. 8B shows an example of the other first resistor comprising two first parts 8*a*. FIG. 8C shows an example of a resistor circuit RC or at least a part thereof comprising the other first resistor RAA and a second resistor, which in this example is provided in the form of a polycrystalline resistor.

Referring to FIG. 8A, the method may comprise providing the substrate 2. The first part 8 of the other first resistor RAA may be defined by or comprised in a portion of the substrate 2. The first part 8 of the other first resistor RAA and the second part 10 of the second resistor RB may be simultaneously doped, as described above. The step of doping the first part 8 of the other first resistor RAA may result in the formation of a well region 6 of the first other resistor RAA. In other words, in this example, the first part 8 of the other first resistor RAA is defined by or comprised by another part 6*b* of the well region 6. The other part 6*b* of the well region may be distal from a surface of the substrate 2 and/or well region 6.

The step of forming the other first resistor RAA may comprise forming an insulating portion 4 in or on the substrate 2 or well region 6, as described above.

The method may comprise forming one or more other doped portions 7*a*, 7*b*, e.g. using one of the doping methods described above. The dopant or dopants may be selected so that the type of doping of the other doped portion 7*a*, 7*b* is opposite to the doping of the first part 8, e.g. the well region 6. In this example, the first part 8 may be n-doped and/or the other doped portions 7*a*, 7*b* may be p-doped. However, it will be appreciated that in other examples, the first part may be p-doped and/or the other doped portions may be n-doped.

The doped portions 7*a*, 7*b* may be formed so as to be arranged adjacent or on either side of the insulating portion 4. Each of the other doped portions 7*a*, 7*b* may define a diffusion area or portion. In other words, extrinsic charge carriers from the dopants in the other doped portions 7*a*, 7*b* may be diffused and/or thermally activated.

In this example, the contacts 12a, 12b may be formed on or via the other doped portion 7a, 7b. For example, one contact 12a may be formed on one other doped portion 6a and the other contact 12b may be formed on the other doped portion 6b.

Referring to FIG. 8B, the other first resistor RAA may comprise two first parts 8a. Although two first parts 8a are shown in FIG. 8B, it will be appreciated that in other examples the other resistor may comprise more or less than two first parts. The other resistor RAA shown in FIG. 8B may be formed in a similar way as the other first resistor RAA shown in FIG. 8A. Any features described in relation to the other resistor RAA shown in FIG. 8A may also apply to the other resistor RAA shown in FIG. 8B.

The first parts 8a of the other first resistor RAA may be defined by or comprised in a portion of the substrate 2. The first parts 8a of the other first resistor RAA and one or more second parts of the second resistor RB (not shown) may be simultaneously doped, as described above. The step of doping the first parts 8a of the other first resistor RAA may result in the formation of a plurality of well regions 6c of the first other resistor RAA (two of which are shown in FIG. 8B). Each first part 8a of the other first resistor RAA may be associated, defined and/or comprised in a respective well region 6c.

The step of forming the other first resistor RAA may comprise forming a plurality of insulating portions 4a, 4b in or on the substrate 2 and/or well region 6. The insulating portions 4a, 4b may be formed prior to or subsequent to the step of doping the first parts 8a of the other first resistor RAA and the one or more second parts 10 of the second resistor RB. At least one insulating portion 4b may be formed so as to be arranged between two adjacent first parts 8a of the other first resistor RAA, as shown in FIG. 8B.

The method may comprise forming a plurality of other doped portions 7a, 7b, e.g. using one of the doping methods described above. The doped portions 7a, 7b may be formed so as to be arranged adjacent and/or on either side of the insulating portions 4a, 4b.

FIG. 8C shows an example of a resistor circuit RC or at least a part thereof. In this example, the first other resistor RAA and second resistor RB are formed in or on the same substrate 2. In this example, each first part 8a is arranged adjacent a second part 10a, or vice versa. Each second portion 10a is formed on a respective insulating portion 4a, which in this example is arranged between two of the other doped portions 7a, 7b and/or two first parts 8a.

Any features and/or method steps described above in relation to FIGS. 7A to 7C and/or FIGS. 8A and 8B may also apply to or be used to form the resistor circuit RC (or part thereof) shown in FIG. 8C.

Figure 9A:
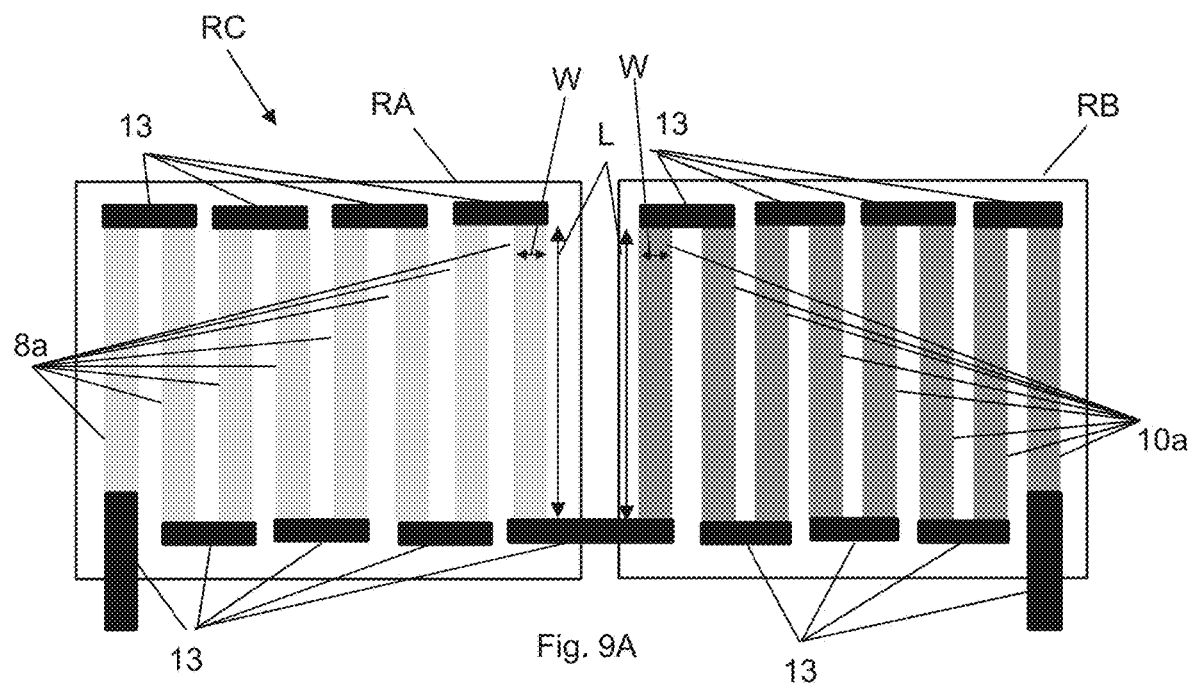
FIG. 9A depicts a top view of an exemplary resistor circuit comprising a first resistor comprising a plurality of first parts and a second resistor a comprising a plurality of second parts.

FIG. 9A shows an example of a resistor circuit RC comprising a first resistor RA comprising the plurality of first parts 8a and a second resistor RB comprising the of second parts 10a. The resistor circuit of FIG. 9A may be considered as an exemplary implementation of the resistor circuit shown in FIG. 6A. The first resistor RA may be provided in the form of a diffusion resistor, for example as shown in FIG. 7A, or in the form of a well resistor, for example as shown in 8B. The second resistor RB may be provided in the form of a polycrystalline resistor, for example as shown in FIG. 7B. In this example, the first resistor RA comprises eight first parts 8a and the second resistor RB comprises eight second parts 10a. It will be appreciated that in other examples, the first and/or second resistors may comprise more or less than eight first and/or second parts, respectively.

In this example, each first part 8a of the first resistor RA comprises an elongated shape. In other words, a length L of each first part 8a may be larger than a width W of each first part 8a. The first parts 8a are arranged side by side. For example, the first parts 8a are arranged such that a/each first part 8a is adjacent and/or parallel (e.g. substantially parallel) to another first part 8a. The first parts 8a are connected or coupled, e.g. electrically coupled or connected, to each other in series. In other words, each first part 8a is connected or coupled to another first part in series, e.g. by one or more conductive lines. The conductive lines may be provided in the form of metal lines 13. The metal lines 13 may be formed from or comprise a metal material, such as for example aluminium, copper or the like. It will be appreciated that the contacts (not shown in FIG. 8A) are formed on each end or end portion of the/each first part 8a and are connected by metal lines 13 to the contacts of another first parts 8a. The first parts 8a are connected or coupled together to form the first resistor RA.

In this example, each second part 10a of the second resistor RB comprises an elongated shape. In other words, a length of each second part 10a may be larger than a width of each second part 10a. The second parts 10a are arranged side by side. For example, the second parts 10a are arranged such that a/each second part 10a is adjacent and/or parallel (e.g. substantially parallel) to another second part 10a. The second parts 10a are connected or coupled, e.g. electrically coupled or connected, to each other in series. In other words, each second part 10a is connected or coupled to another second part in series, e.g. by metal lines 13. It will be appreciated that contacts (not shown in FIG. 8A) are formed on each end or end portion of the/each second part 10a and are connected by metal lines 13 to the contacts of another second part 10a. The second parts 10a are connected or coupled together to form the second resistor RB.

In the example shown in FIG. 9A, the first resistor RA and the second resistor RB are connected in series to one another, e.g. by metal lines 13.

Figure 9B:
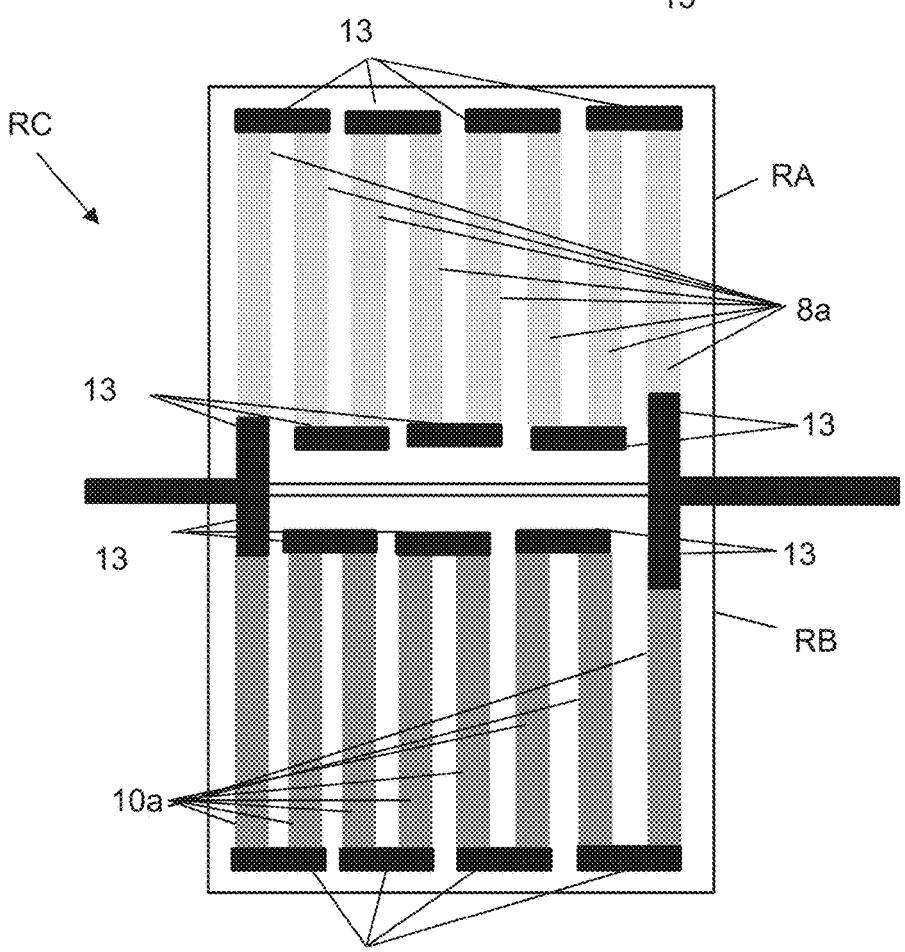
FIG. 9B depicts a top view of another exemplary resistor circuit comprising a first resistor comprising a plurality of first parts and a second resistor a comprising a plurality of second parts.

FIG. 9B shows another example of a resistor circuit RC comprising a first resistor RA comprising the plurality of first parts 8a and a second resistor RB comprising the plurality of second parts 10a. The resistor circuit of FIG. 9B may be considered as an exemplary implementation of the resistor circuit shown in FIG. 4A. The resistor circuit RC shown in FIG. 9B is similar to the resistor circuit shown in FIG. 9A. Any features described in relation to the resistor circuit shown in FIG. 9A may also apply to the resistor circuit shown in FIG. 9B.

In FIG. 9B, the first resistor RA and the second resistor RB are connected in parallel to one another, e.g. by metal lines 13.

Figure 10A:
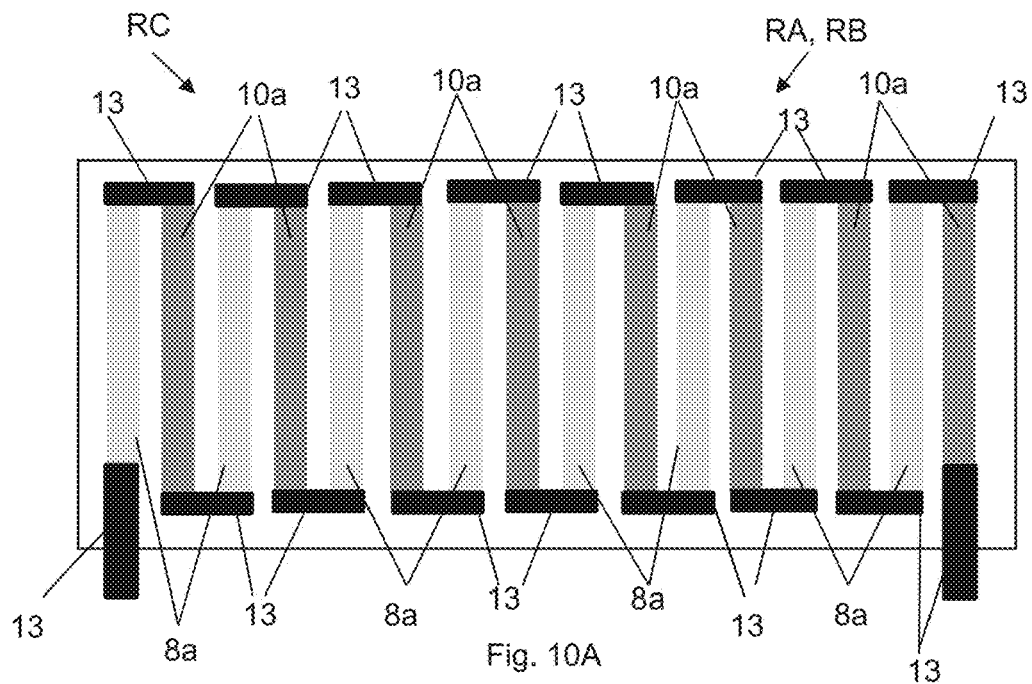
FIG. 10A depicts a top view of another exemplary resistor circuit comprising a first resistor comprising a plurality of first parts and a second resistor a comprising a plurality of second parts.

FIG. 10A shows another example of a resistor circuit RC. The resistor circuit RC shown in FIG. 10A is similar to the resistor circuit shown in FIG. 9A. Any features described in relation to the resistor circuit shown in FIG. 9A may also apply to the resistor circuit shown in FIG. 10A. The resistor circuit of FIG. 10A may be considered as another exemplary implementation of the resistor circuit shown in FIG. 6A. The resistor circuit RC in FIG. 10A may be provided in a form similar to the resistor circuit shown FIG. 7C or FIG. 8C.

In this example, the first parts 8a of the first resistor RA and the second parts 10a of the second resistor RB are alternately arranged. In other words, a/each first part 8a is arranged adjacent and/or parallel to (e.g. substantially parallel to) a second part 10a, or vice versa. The first and second parts 8a, 10a are connected or coupled to each other in series, e.g. by metal lines 13. As such, the first and second resistors RA, RB may be considered as being coupled or connected in series to one another.

Figure 10B:
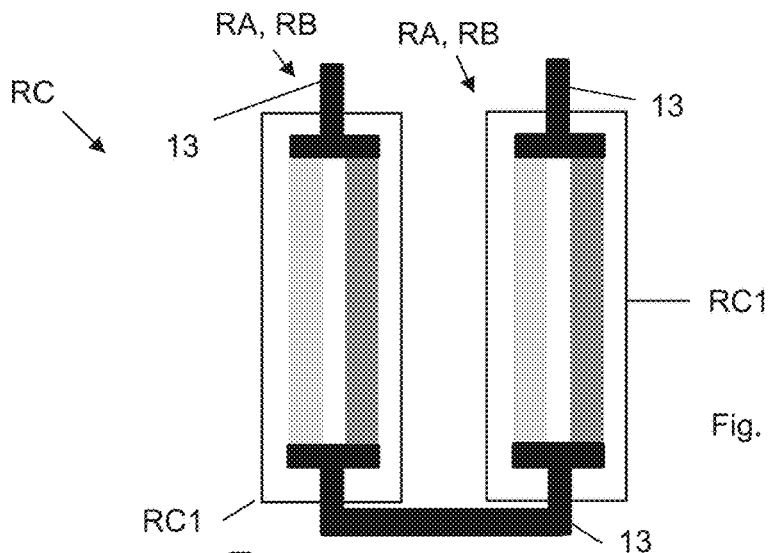
FIG. 10B depicts a top view of another exemplary resistor circuit comprising a first resistor comprising a plurality of first parts and a second resistor a comprising a plurality of second parts.

FIG. 10B shows another example of a resistor circuit RC. The resistor circuit RC shown in FIG. 10B is similar to the resistor circuits shown in FIG. 9A. Any features described in relation to the resistor circuit shown in FIG. 9A may also apply to the resistor circuit shown in FIG. 10B.

In this example, a first part 8a and a second part 10a are connected or coupled to one another in parallel, e.g. by metal lines 13. As such, the first and second resistors RA, RB may be considered as being coupled or connected in parallel to one another. The first part 8a and the second part 10b, e.g. the first resistor RA and second resistor RB, may define a resistor cell or segment RC1. It will be appreciated that in other examples, the resistor cell or segment may comprise more than one first part and/or second part.

The resistor cell or segment RC1 shown in FIG. 10B may be considered as another exemplary implementation of the resistor circuit shown in FIG. 4A. The resistor cell or segment RC1 in FIG. 10B may be provided in a form of a part of the resistor circuit shown FIG. 7C or FIG. 8C.

The resistor circuit RC may comprise a plurality of resistor cells or segments RC1. In this example, the resistor circuit RC comprises two resistor cells or segments. The resistors cells or segments RC1 are connected in series to one another, e.g. by metal lines 13.

It will be appreciated that in other examples, the resistor circuit RC may comprise more or less than two resistor cells or segments. The number of resistor cells or segments RC1 comprised in the resistor circuit RC may be adjusted, varied or changed, e.g. increased or decreased, to adjust, vary or change, e.g. increase or decrease, a resistivity of the resistor circuit RC.

Figure 10C:
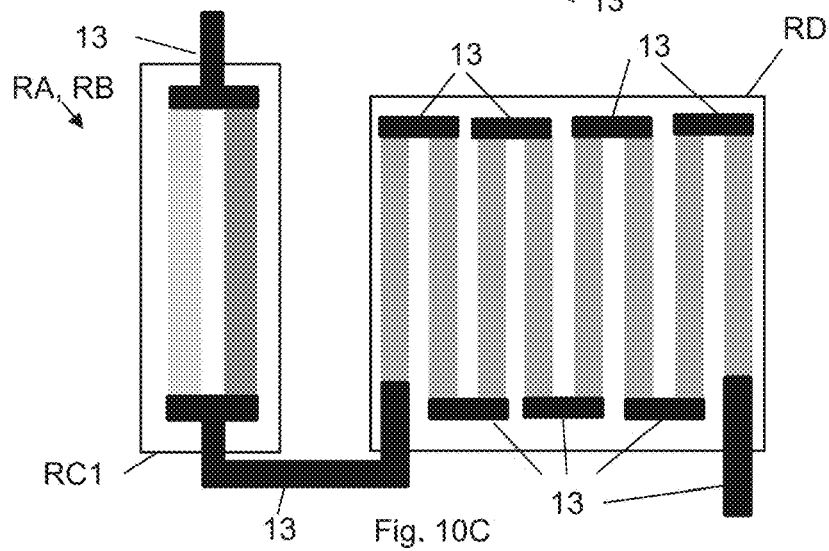
FIG. 10C depicts a top view of another exemplary resistor circuit comprising a first resistor, a second resistor and a third resistor a comprising a plurality of third parts.

FIG. 10C shows another example of a resistor circuit RC. The resistor circuit RC shown in FIG. 10C is similar to the resistor circuit shown in FIG. 10B. Any features described in relation to the resistor circuit shown in FIG. 10B may also apply to the resistor circuit shown in FIG. 10C. The resistor circuit RC shown in FIG. 10C may be considered as an exemplary implementation of the resistor circuit shown in FIG. 5A.

In this example, the resistor circuit comprises a third resistor RD. The third resistor RD is connected in series to the first and second resistors RA, RB, which are connected in parallel, e.g. to form the resistor cell or segment RC1. The third resistor may be the same as the first resistor RA or the second resistor RB shown in FIG. 9A. Although FIG. 10C shows only one resistor cell or segment RC1 connected to the third resistor RD, it will be appreciated that in other examples more than one resistor cell or segment may be connected to the third resistor, e.g. to adjust, vary or change the resistivity of the resistor circuit.

It will be appreciated that in other examples, the third resistor RD shown in FIG. 10C may be connected to the resistor circuit shown in FIG. 9B. Such an arrangement may be considered as another exemplary implementation of the resistor circuit shown in FIG. 5A.

Referring to FIGS. 9A to 10C, it will be appreciated that the resistivity of the resistor circuit RC, resistor cell or segment RC1, the first resistor RA and/or the second resistor RB may be varied, adjusted or changed by selecting the number of first parts and/or the number of second parts, as described above. The selection of the number of first parts and/or the number of second parts may dependent on an arrangement of the resistor circuit, the resistor cell or segment RC1, the first resistor RA and/or the second resistor. Expressed differently, the selection of the number of first parts and/or the number of second parts may dependent on whether the first parts, second parts, the first resistor RA, the second resistor RB and/or the resistor cell or segment RC1 are connected or coupled in series or parallel and/or combinations thereof.

By arranging the first and/or second parts of the first and/or second resistors as described above in relation any one of FIGS. 9A to 10C, the resulting resistor circuit may be more compact and/or space efficient. Although FIGS. 9A to 10C show a parallel arrangement of the first and/or second parts, it will be appreciated that the resistor circuit disclosed herein is not limited to such an arrangement. In other examples, at least one first part may be arranged perpendicularly to at least one other first part or at least one second part. Similarly, at least one third part may be arranged perpendicularly to at least one other third part, at least one first part and/or second part.

Figure 11A:
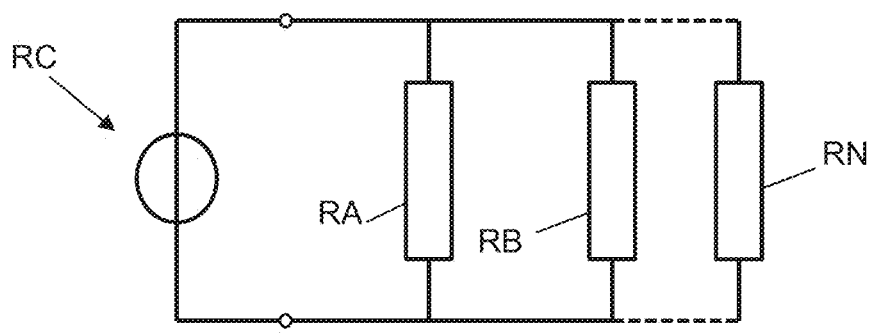
FIG. 11A schematically depicts another example of a resistor circuit formed at least partially using the method of FIGS. 1 and/or 2.
Figure 11B:
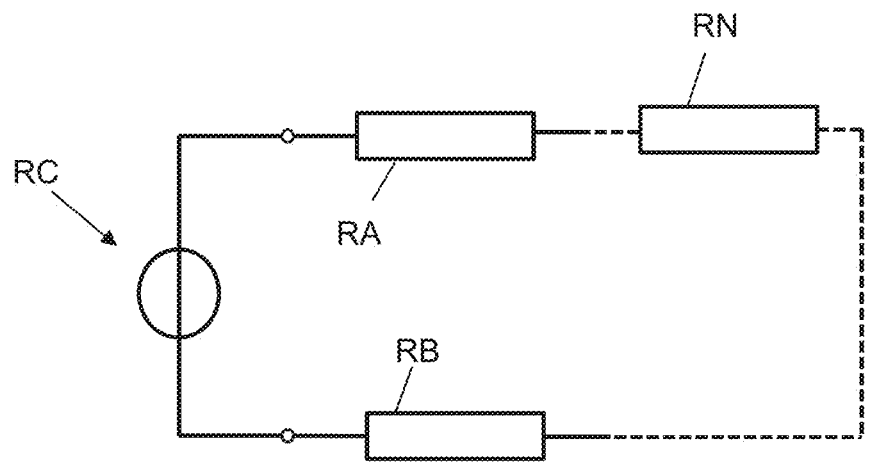
FIG. 11B schematically depicts another example of a resistor circuit formed at least partially using the method of FIGS. 1 and/or 2.

The resistor circuit disclosed herein is not limited to the arrangement of the first, second and/or third resistors, as described above. It will be appreciated that the first, second and/or third resistors may be arranged or connected in a different manner to form a substantially temperature independent resistor. FIGS. 11A and 11B show other examples of a resistor circuit formed using the method of FIGS. 1 and/or 2. In addition, to the steps described above in relation to FIGS. 1 and/or 2, the method may comprise connecting or coupling the first and second resistors RA, RB together. It will be appreciated that the first and second resistors RA, RB may be connected or arranged in parallel or in series. The resistor circuit RC may comprise more than two or more than three resistors RN. The first resistor RA, the second resistor RB and the more than two or more than three resistors RN may be connected or arranged in parallel as shown in FIG. 11A. Alternatively, the first resistor RA, the second resistor RB and the more than two or more than three resistors RN may be connected or arranged in series as shown in FIG. 11B. It will also be appreciated that in some example some of the first resistor RA, the second resistor RB and the more than two or more than three resistors RN may be arranged or connected in parallel to each other and in series with at least one other resistor, or vice versa.

It will be appreciated that one or more steps of the method of forming a resistor circuit may be used, in isolation or combination, to form a part of the resistor circuit, such as for example the first resistor and/or the second resistor. In other words, the method may be used to form at least two resistors for use in a resistor circuit.

It will be appreciated that the resistor circuit described above may be, form or comprise a complementary metal-oxide semiconductor (CMOS) resistor or resistor circuit.

The first resistor, the second resistor and/or the third resistor described above may be considered to be non-silicided.

The term "compensate" may be considered as encompassing substantially compensate. The terms "compensate" and "substantially compensate" may be interchangeably used.

The term "connect" may be considered as encompassing "electrically connect". The term "connect" may be interchangeably used with the terms "couple," "electrically couple" or "electrically connect."

The terms "variation in or change of the linear and/or quadratic temperature coefficients of the first resistor, the linear and/or quadratic temperature coefficients of the second resistor and/or the linear and/or quadratic temperature coefficients of the third resistor" may be considered as encompassing a change of a value or absolute value of the linear and/or quadratic temperature coefficients of the first resistor, the linear and/or quadratic temperature coefficients of the second resistor and/or the linear and/or quadratic temperature coefficients of the third resistor, respectively.

The terms "variation in or change of resistivity or sheet resistance of the first resistor and/or a change of the resistivity or sheet resistance of the second resistor" may be considered as encompassing a change of a value or absolute value of the resistivity or sheet resistance of the first resistor and/or a of a change of a value or absolute value of the resistivity or sheet resistance of the second resistor.

It will be understood that references to a plurality of features may be interchangeably used with references to singular forms of those features, such as for example "at least one" and/or "each". Singular forms of a feature, such as for example "at least one" or "each," may be used interchangeably.

The applicant discloses in isolation each individual feature described herein and any combination of two or more such features, to the extent that such features or combinations are capable of being carried out based on the specification as a whole in the light of the common general knowledge of a person skilled in the art, irrespective of whether such features or combinations of features solve any problems disclosed herein, and without limitation to the scope of the claims. The applicant indicates that aspects of the invention may consist of any such individual feature or combination of features. In view of the foregoing description it will be evident to a person skilled in the art that various modifications may be made within the scope of the invention.

The invention claimed is:

1. A method of forming a resistor circuit, the method comprising:
   forming a first resistor comprising a first type of resistor;
   forming a second resistor comprising a second type of resistor, the first type of resistor being different from the second type of resistor;
   forming a third resistor; and
   simultaneously doping a first part of the first resistor and a second part of the second resistor, the first resistor and the second resistor being configured such that doping of the first part of the first resistor and the second part of the second resistor defines a temperature coefficient of the first resistor and a temperature coefficient of the second resistor, wherein the temperature coefficient of the first resistor and the temperature coefficient of the second resistor have opposite signs and wherein a temperature coefficient of the third resistor is different from at least one of the temperature coefficient of the first resistor and the temperature coefficient of the second resistor.

2. The method of claim 1, wherein the doping of the first part defines or determines a resistivity or sheet resistance of the first resistor and the doping of the second part determines or defines a resistivity or sheet resistance of the second resistor.

3. The method of claim 1, wherein the step of forming the first resistor and/or the second resistor comprises selecting one or more parameters of the first resistor and/or the second resistor so that the temperature coefficient of the first resistor and second the temperature coefficient of the second resistor compensate each other, when the first resistor and the second resistor are coupled or connected together.

4. The method of claim 3, wherein the one or more parameters comprise one or more of: a first length of the first part, a first width of the first part, a first thickness of the first part, a second length of the second part, a second width of the second part and a second thickness of the second part.

5. The method of claim 3, wherein the one or more parameters are selected based on one or more of:
   a material of the first part;
   a material of the second part;
   another material of another part of the first and/or second resistors;
   one or more dopants used to dope the first part and the second part;
   a grain size of the material of the first part;
   a grain size of the material of the second part; and/or
   a grain size of the other material of the other part of the first and/or second resistors.

6. The method of claim 1, wherein the step of simultaneously doping the first part and the second part comprises doping the first part and the second part with at least one of:
   the same dopant or dopants;
   substantially the same dopant dose and/or dopant concentration; and
   substantially the same dopant energy.

7. The method of claim 1, wherein the step of forming the first resistor and/or the second resistor comprises:
   providing a substrate; and
   forming at least one insulating portion on or in the substrate.

8. The method of claim 7, wherein the step of forming the first resistor comprises forming a well region in the substrate, the first part being comprised in or defined by at least a part of the well region.

9. The method of claim 7, wherein the step of forming the second resistor comprises depositing a semiconductor material on the at least one insulating portion to form the second part.

10. The method of claim 1, wherein the method comprises connecting the first resistor and the second resistor to one another such that the temperature coefficient of the first resistor and the temperature coefficient of the second resistor compensate each other.

11. The method of claim 10, comprising connecting the first resistor and the second resistor in series or parallel.

12. The method of claim 1, wherein the first resistor comprises a plurality of first parts and the second resistor comprises a plurality of second parts, the method comprising simultaneously doping the plurality of first parts of the first resistor and the plurality of second parts of the second resistor.

13. The method of claim 12, comprising connecting at least one or each first part of the plurality of first parts to at least one other first part of the plurality of first parts or at least one second part of the plurality of second parts in series or parallel and/or connecting at least one or each second part of the plurality of second parts to at least one other second part of the plurality of second parts or at least one first part of the plurality of first parts in series or in parallel.

14. The method of claim 12, wherein the first part or at least one first part of the plurality of first parts and the second part or at least one second part of the plurality of second parts define a resistor cell or segment, the resistor circuit comprising a plurality of resistor cells or segments, at least one or each resistor cell or segment being connected or coupled to at least one other resistor cell or segment or another resistor in series.

15. The method of claim 1, comprising doping a third part of the third resistor at the same time as the first part of the first resistor and the second part of the second resistor, the third resistor being configured such that doping of the third part of the third resistor defines the temperature coefficient of the third resistor.

16. The method of claim 1, comprising connecting the third resistor to the first resistor and the second resistor such that the temperature coefficient of the first resistor, the temperature coefficient of the second resistor and the temperature coefficient of the third resistor compensate each other.

17. The method of claim 1, wherein the first resistor comprises a plurality of first parts, the second resistor comprises a plurality of second parts and the third resistor comprises a plurality of the third parts, the method comprising simultaneously doping the plurality of first parts of the first resistor, the plurality of second parts of the second resistor, and the plurality of third parts of the third resistor.

18. A resistor circuit formed using the method of claim 1.

19. The resistor circuit of claim 18, wherein resistor circuit is substantially temperature independent and/or substantially insensitive to one or more process variations.

20. The resistor circuit of claim 18, wherein at least one of:
- the temperature coefficient of the first resistor is positive;
- the temperature coefficient of the second resistor is negative;
- the temperature coefficient of the third resistor is positive or negative;
- the first resistor comprises a diffusion resistor or a well resistor;
- the second resistor comprises a polycrystalline resistor; and
- the third resistor comprises a polycrystalline resistor, diffusion resistor or well resistor.

* * * * *